(12) United States Patent
Kim et al.

(10) Patent No.: US 9,929,155 B2
(45) Date of Patent: Mar. 27, 2018

(54) SEMICONDUCTOR DEVICE HAVING SYMMETRIC AND ASYMMETRIC ACTIVE FINS

(71) Applicants: Ju-youn Kim, Suwon-si (KR); Jong-mil Youn, Yongin-si (KR)

(72) Inventors: Ju-youn Kim, Suwon-si (KR); Jong-mil Youn, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/985,385

(22) Filed: Dec. 30, 2015

(65) Prior Publication Data

US 2016/0293598 A1    Oct. 6, 2016

(30) Foreign Application Priority Data

Apr. 2, 2015    (KR) .......................... 10-2015-0046860

(51) Int. Cl.
*H01L 27/08* (2006.01)
*H01L 29/06* (2006.01)
*H01L 27/088* (2006.01)
*H01L 29/78* (2006.01)
*H01L 21/8234* (2006.01)

(52) U.S. Cl.
CPC ...... *H01L 27/0886* (2013.01); *H01L 29/0684* (2013.01); *H01L 29/785* (2013.01); *H01L 21/823406* (2013.01); *H01L 21/823431* (2013.01)

(58) Field of Classification Search
CPC .................. H01L 27/0886; H01L 29/0684
See application file for complete search history.

(56) References Cited

U.S. PATENT DOCUMENTS 7,358,142 B2 * 4/2008 Kang ............... H01L 29/66795
257/E21.442
7,538,391 B2 * 5/2009 Chidambarrao .... H01L 29/0649
257/347

(Continued)

FOREIGN PATENT DOCUMENTS

JP         2008060219 A  *  3/2008  ....... H01L 27/10876
KR         100827525 B1  *  5/2008
WO   WO 2016105412 A1  *  6/2016  ....... H01L 29/42392

*Primary Examiner* — Ida M Soward
(74) *Attorney, Agent, or Firm* — Renaissance IP Law Group LLP

(57) ABSTRACT

A semiconductor device and a method of manufacturing the same are disclosed, which may improve the operating performance of a multi-gate transistor in a highly scaled integrated circuit device. The semiconductor device includes a first active fin unit protruding on a first region of a semiconductor substrate and extending along a first direction. The first active fin unit includes at least one first active fin having left and right profiles, which are symmetric to each other about a first center line perpendicular to a top surface of the semiconductor substrate on a cut surface perpendicular to the first direction. A second active fin unit protrudes on a second region of the semiconductor substrate and includes two second active fins, each having a left and right profiles, which are asymmetric to each other about a second center line perpendicular to the top surface of the semiconductor substrate on a cut surface.

20 Claims, 38 Drawing Sheets

(56) References Cited

U.S. PATENT DOCUMENTS

| | | | |
|---|---|---|---|
| 7,692,251 B2* | 4/2010 | Chung | H01L 21/82341 257/330 |
| 7,745,319 B2 | 6/2010 | Tang et al. | |
| 7,800,152 B2* | 9/2010 | Zhu | H01L 29/66795 257/302 |
| 7,812,375 B2* | 10/2010 | Lee | H01L 27/105 257/208 |
| 7,994,583 B2* | 8/2011 | Inaba | G11C 11/412 257/369 |
| 8,026,138 B2* | 9/2011 | Lee | H01L 27/10876 257/E27.095 |
| 8,039,326 B2 | 10/2011 | Knorr et al. | |
| 8,501,607 B1 | 8/2013 | Juengling | |
| 8,546,891 B2* | 10/2013 | Chang | H01L 29/06 257/401 |
| 8,586,429 B2 | 11/2013 | Davis et al. | |
| 8,637,371 B2 | 1/2014 | Chang et al. | |
| 8,674,413 B1* | 3/2014 | Chi | H01L 27/0924 257/213 |
| 8,692,316 B2 | 4/2014 | Xie | |
| 8,748,280 B2 | 6/2014 | Tang et al. | |
| 8,866,206 B2* | 10/2014 | Sudo | H01L 21/82343 257/288 |
| 9,070,577 B2* | 6/2015 | Lee | H01L 27/0886 |
| 9,147,730 B2* | 9/2015 | Xie | H01L 29/0692 |
| 9,305,825 B2* | 4/2016 | Youn | H01L 21/76229 |
| 9,443,935 B2* | 9/2016 | Oh | H01L 29/66477 |
| 9,455,198 B1* | 9/2016 | Yu | H01L 21/82348 |
| 9,583,394 B2* | 2/2017 | Feng | H01L 27/0886 |
| 9,583,398 B2* | 2/2017 | Liaw | H01L 21/82343 |
| 2011/0068431 A1 | 3/2011 | Knorr et al. | |
| 2011/0079838 A1* | 4/2011 | Lee | H01L 27/11524 257/316 |
| 2013/0056826 A1 | 3/2013 | Liu et al. | |
| 2013/0065326 A1* | 3/2013 | Sudo | H01L 27/228 438/3 |
| 2013/0270559 A1* | 10/2013 | Hafez | H01L 27/11206 257/50 |
| 2013/0273705 A1 | 10/2013 | Liu et al. | |
| 2013/0277720 A1 | 10/2013 | Kim et al. | |
| 2014/0113420 A1* | 4/2014 | Sargunas | H01L 21/82382 438/231 |
| 2014/0227848 A1* | 8/2014 | Kang | H01L 21/82343 438/283 |
| 2014/0299942 A1* | 10/2014 | Baek | H01L 21/76237 257/401 |
| 2014/0315371 A1* | 10/2014 | Cai | H01L 21/82382 438/424 |
| 2014/0327074 A1* | 11/2014 | Tsao | H01L 27/0886 257/337 |
| 2014/0327087 A1* | 11/2014 | Kim | H01L 27/10826 257/392 |
| 2015/0076654 A1* | 3/2015 | Ganz | H01L 21/76 257/506 |
| 2016/0013183 A1* | 1/2016 | Basker | H01L 27/0886 257/401 |
| 2016/0056083 A1* | 2/2016 | Do | H01L 21/82343 438/299 |
| 2016/0181161 A1* | 6/2016 | Song | H01L 29/66803 257/345 |
| 2016/0181243 A1* | 6/2016 | Youn | H01L 21/76229 257/401 |
| 2016/0204112 A1* | 7/2016 | Baek | H01L 29/7851 257/401 |
| 2016/0268394 A1* | 9/2016 | Hur | H01L 21/02532 |
| 2017/0194324 A1* | 7/2017 | You | H01L 27/0886 |

* cited by examiner

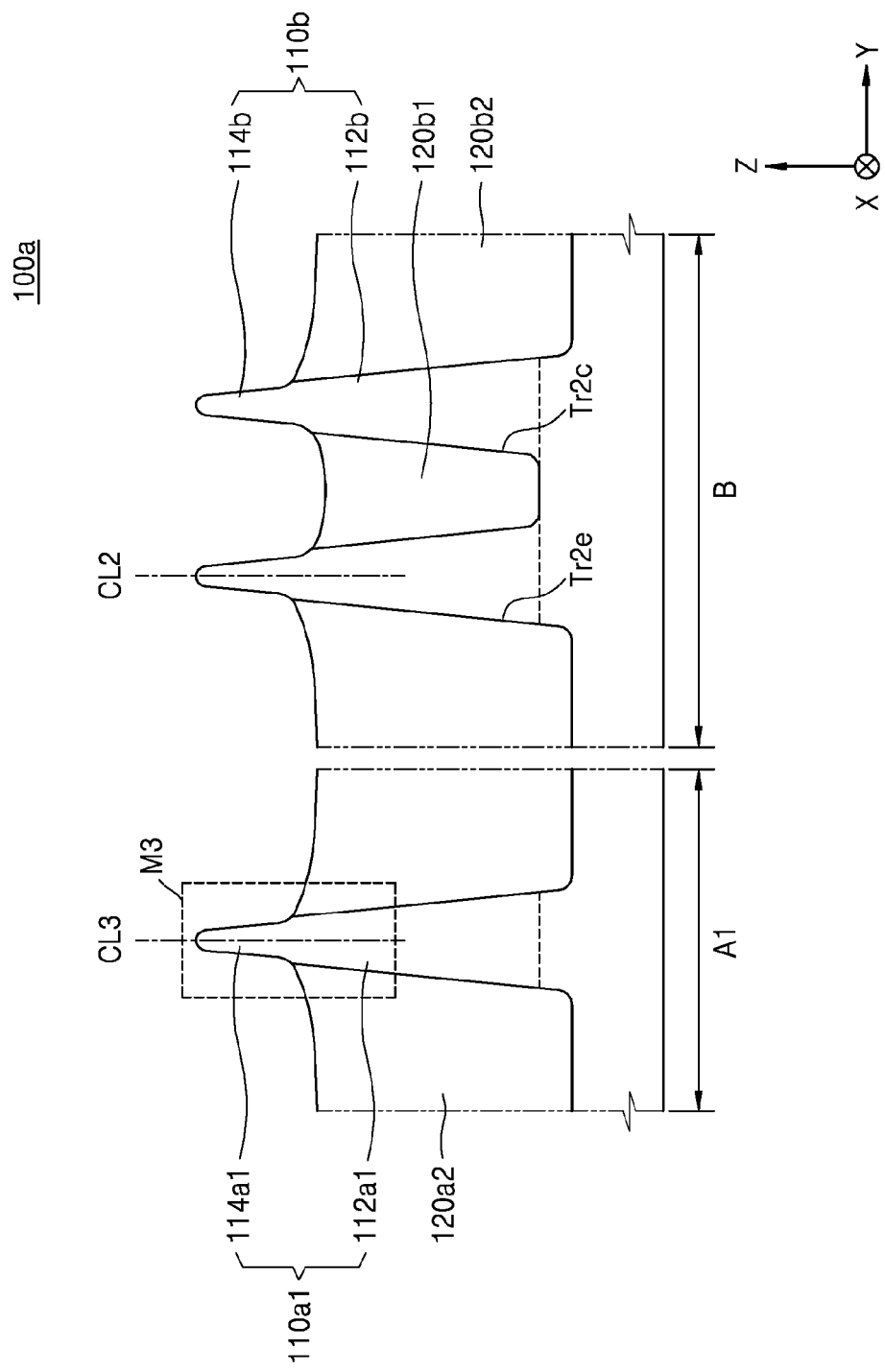

FIG. 15A
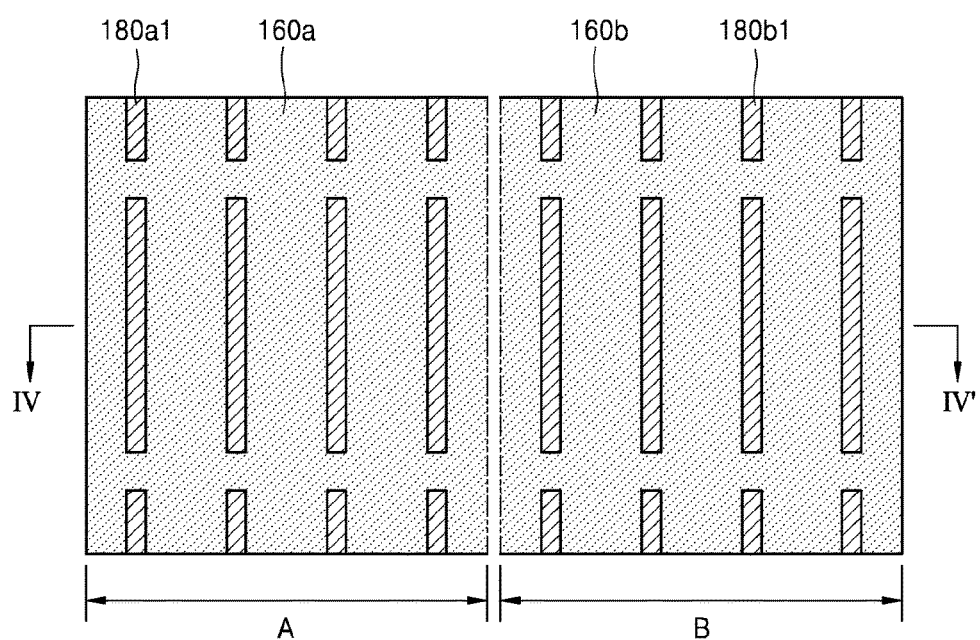
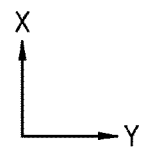

SEMICONDUCTOR DEVICE HAVING SYMMETRIC AND ASYMMETRIC ACTIVE FINS

CROSS-REFERENCE TO RELATED APPLICATION

This application claims the benefit of Korean Patent Application No. 10-2015-0046860, filed on Apr. 2, 2015, in the Korean Intellectual Property Office, the disclosure of which is incorporated herein in its entirety by reference.

BACKGROUND

Embodiments exemplarily described herein relate to a semiconductor device, and more particularly, to a semiconductor device including active fins and a method of manufacturing the same.

In recent years, the downscaling of semiconductor devices has rapidly progressed. Also, since the semiconductor devices require not only high operating speeds but also accurate operations, research has been variously conducted into optimizing structures of transistors included in the semiconductor devices. In particular, multi-gate transistors have been proposed as a scaling technique for increasing the density of integrated circuit (IC) devices. In the multi-gate transistor, an active fin is formed on a substrate, and a gate is formed on the active fin. Since the multi-gate transistor uses a three-dimensional (3D) channel, it is easy to scale the multi-gate transistor. Also, even if a gate length is not increased, current controllability may be improved. Furthermore, a short channel effect (SCE), which may affect an electric potential of a channel region due to a drain voltage, may be effectively inhibited.

SUMMARY

Embodiments exemplarily described herein are directed to a semiconductor device having such a structure as to improve the operating performance of a multi-gate transistor in a highly-scaled integrated circuit (IC) device, and a method of manufacturing the semiconductor device.

According to one embodiment, there is provided a semiconductor device including a semiconductor substrate. A first active fin unit protrudes on a first region of the semiconductor substrate and extends along a first direction. The first active fin unit includes at least one first active fin, each of which has a left profile and a right profile that are symmetric to each other about a first center line perpendicular to a top surface of the semiconductor substrate on a cut surface perpendicular to the first direction. A second active fin unit protrudes on a second region of the semiconductor substrate and extends in the first direction. The second active fin unit includes two second active fins, each of which has a left profile and a right profile that are asymmetric to each other about a second center line perpendicular to the top surface of the semiconductor substrate on the cut surface. Each of the first and second active fins includes a lower active fin surrounded by a device isolation layer and an upper active fin protruding from the device isolation layer. Each of the first center line and the second center line is defined as a straight line disposed approximately equidistant between left and right points of the lower active fin, which are at the same height above the top surface of the semiconductor substrate.

According to another embodiment, there is provided a semiconductor device including a semiconductor substrate. A first active fin unit protrudes on a first region of the semiconductor substrate and extends along a first direction. The first active fin unit includes one first active fin having a left profile and a right profile that are symmetrical about a first center line perpendicular to a top surface of the semiconductor substrate on a cut surface perpendicular to the first direction. A second active fin unit protrudes on a second region of the semiconductor substrate and extends in the first direction. The second active fin unit includes two second active fins, each of which has a left profile and a right profile that are asymmetrical about a second center line perpendicular to the top surface of the semiconductor substrate on the cut surface. A third active fin unit protrudes on a third region of the semiconductor substrate and extends in the first direction. The third active fin unit includes at least one third active fin, each of which has a left profile and a right profile that are symmetrical about a third center line perpendicular to the top surface of the semiconductor substrate on the cut surface. Each of the first, second, and third active fins includes a lower active fin surrounded by a device isolation layer and an upper active fin protruding from the device isolation layer. Each of the first center line, the second center line, and the third center line is defined as a straight line disposed approximately equidistant between left and right points of the lower active fin, which are at the same height above the top surface of the semiconductor substrate.

According to another embodiment, there is provided a method of manufacturing a semiconductor device. The method includes forming a plurality of sacrificial layer patterns on a semiconductor substrate. The sacrificial layer patterns extend along a first direction and are disposed along a second direction perpendicular to the first direction. Spacers are disposed on two sidewalls of each of the sacrificial layer patterns and, thereafter, the sacrificial layer patterns are removed. A plurality of first trenches and a plurality of active fins are formed by etching the semiconductor substrate by using the spacers as a mask. A first insulating layer is formed to fill the first trenches and cover the active fins, and is then planarized. The first insulating layer, the active fins, and the semiconductor substrate are etched by using a photomask pattern covering predetermined regions of the first insulating layer and the active fins, thereby forming a plurality of second trenches. A first active fin unit including one first active fin or at least three active fins and a second active fin unit including two second active fins are defined by the second trenches. A second insulating layer is formed to fill the second trenches and cover the active fins and the first insulating layer, and is then planarized. Upper portions of the active fins are made to protrude by etching portions of the first and second insulating layers. At least one first active fin of the first active fin unit protrudes such that a left profile and a right profile of the first active fin are symmetric to each other about a first center line perpendicular to a top surface of the semiconductor substrate on a cut surface perpendicular to the first direction. Each of the two second active fins of the second active fin unit protrudes such that a left profile and a right profile of each of the second active fins are asymmetric to each other about a second center line perpendicular to the top surface of the semiconductor substrate on the cut surface.

According to another embodiment, there is provided a method of manufacturing a semiconductor device. The method includes forming a plurality of sacrificial layer patterns on a semiconductor substrate. The sacrificial layer patterns extend along a first direction and are disposed along a second direction perpendicular to the first direction. Spacers are disposed on two sidewalls of each of the sacrificial layer patterns and, thereafter, the sacrificial layer patterns are removed. A plurality of first trenches and a plurality of active fins are formed by etching the semiconductor substrate by using the spacers as a mask. A first insulating layer is formed to fill the first trenches and cover the active fins, and is then planarized. The first insulating layer, the active fins, and the semiconductor substrate are etched by using a photomask pattern covering predetermined regions of the first insulating layer and the active fins, thereby forming a plurality of second trenches. A first active fin unit including one first active fin, a second active fin unit including two second active fins, and a third active fin unit including at least three third active fins are defined by the second trenches. A second insulating layer is formed to fill the second trenches and cover the active fins and the first insulating layer, and is then planarized. Upper portions of the active fins are made to protrude by etching portions of the first and second insulating layers. The first active fin of the first active fin unit protrudes such that a left profile and a right profile of the first active fin are symmetric to each other about a first center line perpendicular to a top surface of the semiconductor substrate on a cut surface perpendicular to the first direction. Each of the two second active fins of the second active fin unit protrudes such that a left profile and a right profile of each of the second active fins are asymmetric to each other about a second center line perpendicular to the top surface of the semiconductor substrate on the cut surface At least one of the third active fins of the third active fin protrudes such that a left profile and a right profile of the at least one third active fin are symmetrical to each other about a third center line perpendicular to the top surface of the semiconductor substrate on the cut surface.

BRIEF DESCRIPTION OF THE DRAWINGS

Exemplary embodiments of the invention will be more clearly understood from the following detailed description taken in conjunction with the accompanying drawings in which:

FIG. 8 is a cross-sectional view of a semiconductor device according to an exemplary embodiment, which corresponds to the cross-sectional view of the semiconductor device shown in FIG. 2;

DETAILED DESCRIPTION OF THE EMBODIMENTS

Figure 1:
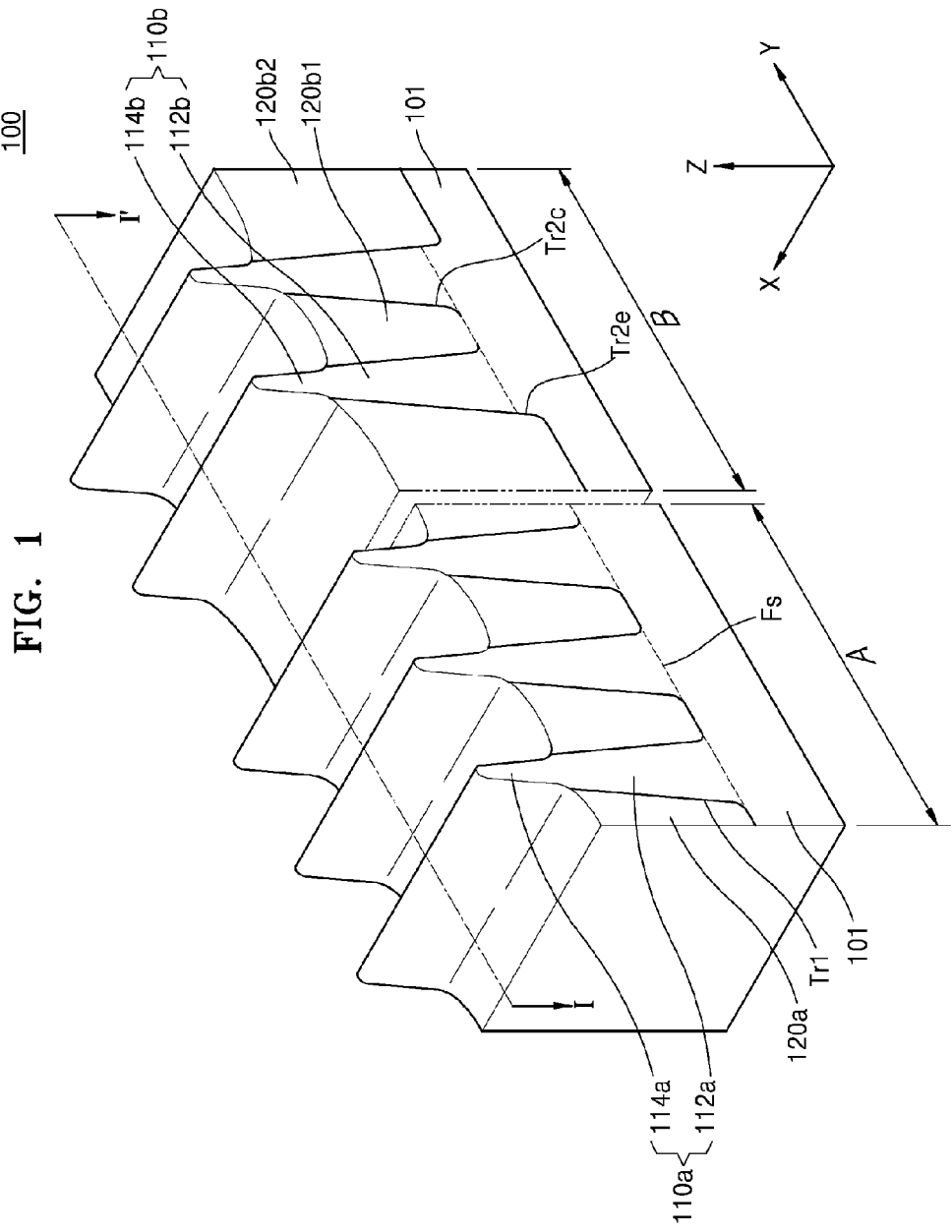
FIG. 1 is a perspective view of a semiconductor device according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

Exemplary embodiments of the inventive concept will now be described more fully hereinafter with reference to the accompanying drawings. The embodiments described below may, however, be embodied in different forms and should not be construed as limited to the disclosure set forth herein. Rather, these embodiments are provided so that this disclosure is thorough and complete and fully conveys the scope of the inventive concept to one skilled in the art.

Spatially relative terms, such as "above", "upper", "below", "lower", "left", "right" and the like, may be used herein to describe the relationship of one element or feature to another element(s) or feature(s) as illustrated in the figures. It will be understood that the spatially relative terms are intended to encompass different orientations of a device in use or operation, in addition to the orientation depicted in the figures. For example, if the device in the figures is turned over, elements described as "above" other elements or features would then be oriented "below" the other elements or features. Thus, the spatially relative term "above" can encompass both an orientation of above and below. An element may be otherwise oriented (rotated 90 degrees or at other orientations), and the spatially relative descriptors used herein may be interpreted accordingly.

It will be understood that when an element or layer is referred to as being "on" or "connected to" another element or layer, it can be directly on or connected to the other element or layer or a third element or layer may be intervened. In the drawings, the thicknesses of layers and regions may be exaggerated for clarity. Descriptions of components and processing techniques that are irrelevant to the embodiments of the present inventive concept are omitted for brevity. Like reference numerals refer to like elements throughout. The terminology used herein to describe embodiments of the inventive concept is not intended to limit the scope of the inventive concept.

Figure 2:
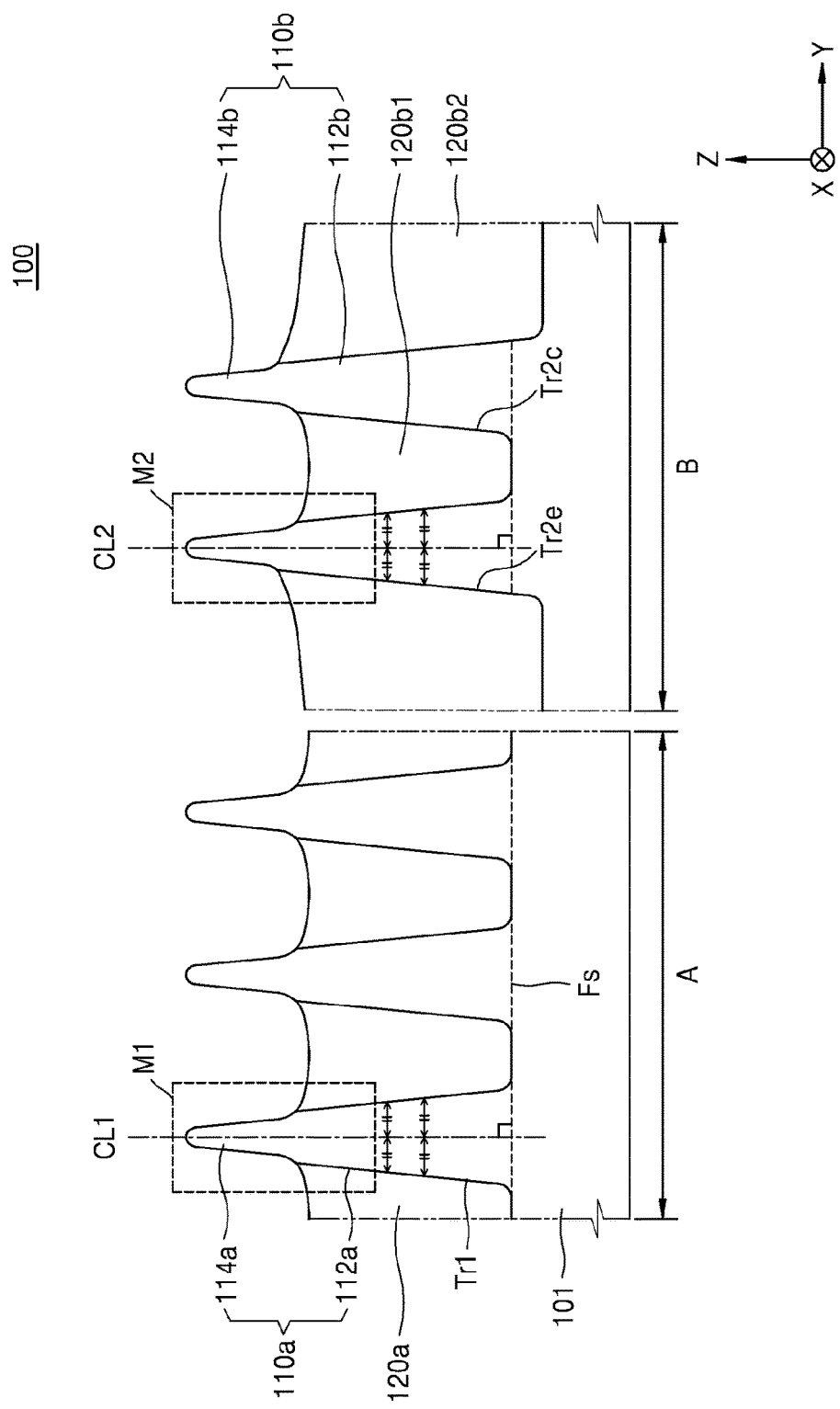
FIG. 2 is a cross-sectional view taken along a line I-I' of the semiconductor device shown in FIG. 1.

FIG. 1 is a perspective view of a semiconductor device 100 according to an exemplary embodiment, and FIG. 2 is a cross-sectional view taken along a line I-I' of the semiconductor device 100 shown in FIG. 1.

Referring to FIGS. 1 and 2, the semiconductor device 100 according to the present embodiment may include a semiconductor substrate 101, device isolation layers (e.g., a first device isolation layer 120a and a second device isolation layer 120b1 and 120b2), and active fins (e.g., a first active fin 110a and a second active fin 110b). Although the semiconductor device 100 may include gate structures, which may cover portions of the first and second active fins 110a and 110b and extend along one direction (e.g., along the "y" direction), the illustration of the gate structures is omitted for brevity.

The semiconductor substrate 101 may include a first region A and a second region B. The first and second active fins 110a and 110b may extend on the semiconductor substrate 101 along a first direction (e.g., along a "x" direction) and be defined by the first and second device isolation layers 120a, 120b1, and 120b2.

In one embodiment, the semiconductor substrate 101 may be provided as a silicon-based substrate, such as a bulk wafer or a silicon-on-insulator (SOI) wafer. In other embodiments, the semiconductor substrate 101 may include a Group IV semiconductor such as germanium (Ge), a Group IV-IV compound semiconductor, such as silicon germanium (SiGe) or silicon carbide (SiC), or a Group III-V compound semiconductor, such as gallium arsenide (GaAs), indium arsenide (InAs), or indium phosphide (InP). In other embodiments, the semiconductor substrate 101 may be provided as a SiGe wafer, an epitaxial wafer, a polished wafer, or an annealed wafer, or the like.

The semiconductor substrate 101 may be a p-type or n-type substrate. For example, the semiconductor substrate 101 may be a p-type substrate containing a p-type dopant or an n-type substrate containing an n-type dopant.

The first and second device isolation layers 120a, 120b1, and 120b2 may be regions configured to define the first and second active fins 110a and 110b and surround opposite side surfaces of lower portions of the first and second active fins 110a and 110b. Also, the device isolation layers 120a, 120b1, and 120b2 may be disposed between the first and second active fins 110a and 110b and electrically isolate the first and second active fins 110a and 110b from each other. The first device isolation layer 120a may be disposed in the first region A, and the second device isolation layer 120b1 and 120b2 may be disposed in the second region B. Also, the second device isolation layer 120b1 and 120b2 may include a central second device isolation layer 120b1 and an outer second device isolation layer 120b2.

The first device isolation layer 120a, the central second device isolation layer 120b1, and the outer second device isolation layer 120b2 may have different structures. In another embodiment, however, the first device isolation layer 120a may have substantially the same structure as the central second device isolation layer 120b1. For example, a width of the outer second device isolation layer 120b2 along a second direction (e.g., along a "y" direction) may be greater than a width of the first device isolation layer 120a or the central second device isolation layer 120b1 in the second direction. Also, a depth of the outer second device isolation layer 120b2 in a third direction (e.g., in the "z" direction) may be greater than a depth of the first device isolation layer 120a or the central second device isolation layer 120b1 in the third direction (e.g., in the "z" direction). Furthermore, a top surface of the outer second device isolation layer 120b2 may have a different structure from a top surface of the first device isolation layer 120a or the central second device isolation layer 120b1.

Specific structures of the first device isolation layer 120a, the central second device isolation layer 120b1, and the outer second device isolation layer 120b2 will be described in further detail with reference to FIGS. 6A and 6B.

The device isolation layers 120a, 120b1, and 120b2 may be formed by filling trenches Tr1, Tr2c, and Tr2e formed in the semiconductor substrate 101, with an insulating layer. The insulating layer may include, for example, at least one of a silicon oxide layer, a silicon nitride layer, a silicon oxynitride layer, and a combination thereof. Specifically, the first device isolation layer 120a may be formed in a first trench Tr1, the central second device isolation layer 120b1 may be formed in a central second trench Tr2c, and the outer second device isolation layer 120b2 may be formed in an outer second trench Tr2e.

The first and second active fins 110a and 110b may protrude from a top surface Fs of the semiconductor substrate 101 in a third direction (e.g., in the "z" direction), and extend along the first direction (e.g., along the "x" direction). The first and second active fins 110a and 110b may be disposed on the semiconductor substrate 101 to be apart from each other along the second direction (y direction).

The first active fin 110a may be disposed in the first region A, and the second active fin 110b may be disposed in the second region B. At least three first active fins 110a may be disposed in the first region A, while two second active fins 110b may be disposed in the second region B. Also, each of the first active fins 110a may include a first lower active fin 112a and a first upper active fin 114a. Likewise, each of the second active fins 110b may include a second lower active fin 112b and a second upper active fin 114b.

Two side surfaces of the first and second lower active fins 112a and 112b may be surrounded by the device isolation layers 120a, 120b1, and 120b2. Specifically, two side surfaces of each of the first lower active fins 112a may be surrounded by the first device isolation layer 120a and two side surfaces of each of the two second lower active fins 112b may be surrounded by the central second device isolation layer 120b1 and the outer second device isolation layer 120b2.

The first and second upper active fins 114a and 114b may protrude from the device isolation layers 120a, 120b1, and 120b2. For example, each of the first upper active fins 114a may protrude from the top surface of the first device isolation layer 120a, and each of the two second upper active fins 114b may protrude from top surfaces of the central second device isolation layer 120b1 and the outer second device isolation layer 120b2.

The first upper active fins 114a may have a different structure than the second upper active fins 114b. For example, the first upper active fins 114a may have a symmetrical structure about a first center line CL1 perpendicular to the top surface Fs of the semiconductor substrate 101. In contrast, the second upper active fins 114b may have an asymmetrical structure about a second center line CL2 perpendicular to the top surface Fs of the semiconductor substrate 101.

For purposes of discussion herein, the center lines CL1 and CL2 of the active fins 110a and 110b may be considered as straight lines that are substantially perpendicular to the top surface Fs of the semiconductor substrate 101. Further, the center lines CL1 and CL2 are approximately equidistant between left and right points of the lower active fins 112a and 112b (e.g., when viewed from a cut surface substantially perpendicular to the first direction (e.g., the "x" direction), which are at identical heights above the top surface Fs of the semiconductor substrate 101.

For example, as shown in FIG. 2, it can be seen that the first center line CL1 is the straight line that approximately equidistant between left and right points of the first lower active fin 112a of a first active fin 110a, which are at identical heights above the top surface Fs of the semiconductor substrate 101. Also, it can be seen that the second center line CL2 is the straight line that is the same distance from the left and right points of the second lower active fin 112b of a second active fin 110a, which are at identical heights above the top surface Fs of the semiconductor substrate 101.

For reference, since the second upper active fin 114b is asymmetrical about the second center line CL2, distances from left and right points of the second upper active fin 114b, which are at identical heights above the top surface Fs of the semiconductor substrate 101, to the second center line C may be different.

Each of the first upper active fins 114a and the second upper active fins 114b may be determined to be symmetrical or asymmetrical based on various standards. The symmetry and asymmetry of the first upper active fins 114a and the second upper active fins 114b will be described in further detail with reference to FIGS. 3A to 5C.

Meanwhile, the first lower active fins 112a and the second lower active fins 112b may be substantially symmetrical structures. For example, each of the first lower active fins 112a may be symmetrical about a corresponding first center line CL1, and each of the second lower active fins 112b may be symmetrical about a corresponding second center line CL2.

The active fins 110a and 110b may include dopant regions formed by implanting impurity ions (i.e., a dopant) into the semiconductor substrate 101. For example, the active fins 110a and 110b may include source and drain regions formed by implanting a dopant into the semiconductor substrate 101 at a dopant concentration of about $1 \times 10^{20}/cm^3$ or more.

In one embodiment, the first active fin 110a and the second active fin 110b may be formed from the same material as the semiconductor substrate 101. Accordingly, the first and second active fins 110a and 110b may include a semiconductor element, such as silicon, germanium, etc., or may be provided as a compound semiconductor, such as a Group IV-IV compound semiconductor or a Group III-V compound semiconductor. For example, the first active fin 110a and the second active fin 110b may include a Group IV-IV compound semiconductor, such as a binary compound or ternary compound containing at least two of carbon (C), silicon (Si), germanium (Ge), and tin (Sn), or a compound formed by doping the binary compound or ternary compound with a Group IV element. Also, the first active fin 110a and the second active fin 110b may include a Group III-V compound semiconductor, for example, any one of a binary compound, a ternary compound, or a quaternary compound, which is formed by combining at least one Group III element of aluminum (Al), gallium (Ga), and indium (In) with one Group V element of phosphorus (P), arsenic (As), and antimony (Sb). A method of forming the first active fin 110a and the second active fin 110b will be described in further detail with reference to FIGS. 13A to 21B.

In one embodiment, an epitaxial layer (hereinafter, referred to as an epi-layer) may, optionally, be grown on the upper active fins 114a and 114b (e.g., at outer portions of two side surfaces of a gate structure). Thus, when the upper active fins 114a and 114b include the epi-layer, the upper active fins 114a and 114b may include a material that is compressively-stressed or a material that is in a state of tension according to a required channel type of a transistor. For example, when a p-type transistor is formed, the epi-layer of the upper active fins 114a and 114b may include a material that is compressively stressed. For example, when the lower active fins 112a and 112b are formed of silicon, the epi-layer of the upper active fins 114a and 114b may be formed of a material having a higher lattice constant than silicon (e.g., silicon germanium (SiGe)). When an n-type transistor is formed, the epi-layer of the upper active fins 114a and 114b may include a material that is in a state of tension. For example, when the lower active fins 112a and 112b are formed of silicon, the upper active fins 114a and 114b may be formed of a material having a lower lattice constant than silicon (e.g., silicon carbide (SiC)). In another embodiment, when the lower active fins 112a and 112b are formed of silicon, the epi-layer of the upper active fins 114a and 114b may be formed of silicon.

In the following descriptions, when elements are not clearly distinguished from one another by using the terms "first" and "second", an element denoted by a reference letter "a" may refer to a structure formed in the first region A, while an element denoted by a reference letter "b" may refer to a structure formed in the second region B.

In the semiconductor device 100, at least three first active fins 110a may be disposed in the first region A, while two second active fins 110b may be disposed in the second region B. Also, the first active fin 110a may have a symmetrical structure about the first center line CL1, while the second active fin 110b may have an asymmetrical structure about the second center line CL2. By disposing different numbers of active fins, having different structures, in different regions of the semiconductor substrate 101, the reliability and operating performance of the semiconductor device 100 may be improved. For example, a plurality of first active fins 110a having identical structures may be disposed in the first region A and each of the first active fins 110a may have a symmetric structure so that, when gate structures are formed on the first active fins 110a, transistors having uniform characteristics may be formed. Also, two second active fins 110b may be disposed in the second region B, each having an asymmetrical structure such that an outer portion of each of the second active fins 110b has a relatively gentle inclination. Thus, when a gate structure is formed on the second active fins 110b, a transistor having improved operating performance may be formed by reducing failures in an edge portion of the transistor.

The first region A and the second region B may be electrically-connected regions or electrically-isolated regions. In some embodiments, the first region A and the second region B may serve identical or different functions. For example, the first region A may be a portion of a logic region, and the second region B may be another portion of the logic region. In some other embodiments, the first region A may be any one of a memory region and a non-memory region, and the second region B may be the other one of the memory region and the non-memory region. Here, the memory region may include a static random access memory (SRAM) region, a dynamic RAM (DRAM) region, a magnetic RAM (MRAM) region, a resistive RAM (RRAM) region, and/or a phase-change RAM (PRAM) region, and the non-memory region may include the logic region.

Figure 3A:
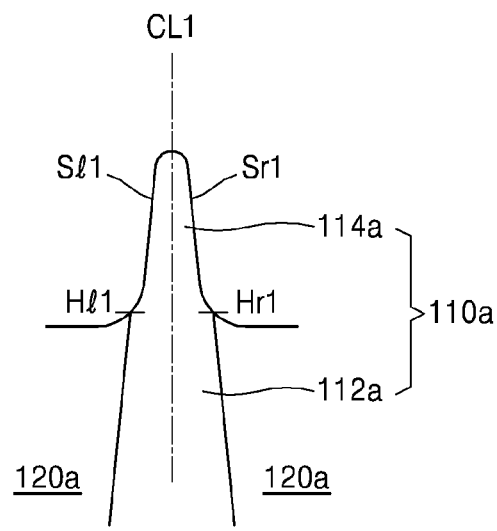
FIGS. 3A and 3B are enlarged views of regions M1 and M2 of the semiconductor device shown in FIG. 2.
Figure 3B:
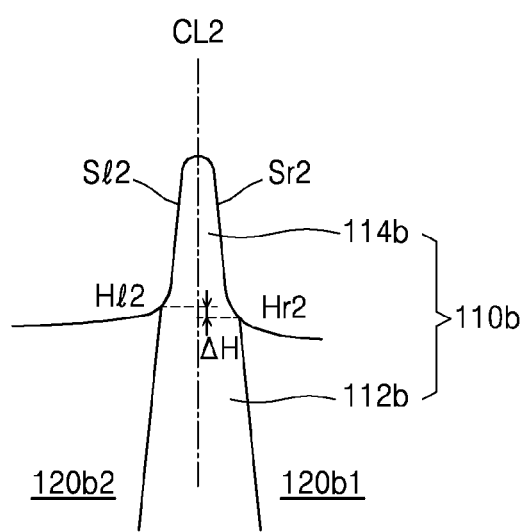

FIGS. 3A and 3B are enlarged views of regions M1 and M2 of the semiconductor device 100 shown in FIG. 2. FIG. 3A is an enlarged view of the region M1, and FIG. 3B is an enlarged view of the region M2.

Referring to FIG. 3A, the first active fin 110a of the first region A may include the first lower active fin 112a having two side surfaces surrounded by the first device isolation layer 120a and the first upper active fin 114a protruding from the first device isolation layer 120a. It may be determined whether the first active fin 110a is symmetrical or not by comparing points at which a left side surface Sl1 and a right side surface Sr1 of the first upper active fin 114a protrude from the first device isolation layer 120a.

For example, both the left side surface Sl1 and right side surface Sr1 of the first upper active fin 114a may protrude from the first device isolation layer 120a. Here, the left side surface Sl1 may protrude from the first device isolation layer 120a at a first point Hl1, while the right side surface Sr1 may protrude from the first device isolation layer 120a at a second point Hr1. As shown in FIG. 3A, the first point Hl1 may be at substantially the same height above the top surface Fs of the semiconductor substrate 101 as the second point Hr1. Accordingly, the first active fin 110a may be determined as having a symmetrical structure.

In one embodiment, the first active fin 110a can be considered to have a symmetrical structure because the first device isolation layers 120a surrounding two side surfaces of the first lower active fin 112a have substantially identical structures. For example, since the first device isolation layers 120a have substantially identical structures (e.g., top surface profiles) on the two side surfaces of the first lower active fin 112a, the protruding first and second points Hl1 and Hr1 on the left side surface Sl1 and the right side surface Sr1 of the first upper active fin 114a, which extends from the first lower active fin 112a along a third direction (e.g., along the "z" direction), may be at substantially the same height above the top surface Fs of the semiconductor substrate 101.

Even if the protruding points Hl1 and Hr1 on the left side surface Sl1 and the right side surface Sr1 of the first upper active fin 114a are measured to be substantially the same height, distances from the first center line CL1 to the protruding points Hl1 and Hr1 may be compared to each other to increase the precision with which the first active fin 110a is determined to be symmetrical. For example, if the protruding points Hl1 and Hr1 on the left side surface Sl1 and the right side surface Sr1 of the first upper active fin 114a are at identical heights above the top surface Fs of the semiconductor substrate 101 and the distances from the first center line CL1 to the protruding points Hl1 and Hr1 are identical, then the first active fin 110a may be determined to be symmetrical. Otherwise, if the protruding points Hl1 and Hr1 of the left side surface Sl1 and the right side surface Sr1 of the first upper active fin 114a are at identical heights but the distances from the first center line CL1 to the protruding points Hl1 and Hr1 are different, the first active fin 110a may be determined as being asymmetrical.

Referring to FIG. 3B, the second active fin 110b of the second region B may include the second lower active fin 112b having two side surfaces surrounded by the second device isolation layer 120b1 and 120b2 and the second upper active fin 114b protruding from the second device isolation layer 120b1 and 120b2. Similarly, it may be determined whether the second active fin 110b is symmetrical or not by comparing points at which a left side surface Sl2 and a right side surface Sr2 on the second upper active fin 114b protrude from the second device isolation layer 120b1 and 120b2.

A structure of the second active fin 110b will now be described in detail. A left side surface of the second lower active fin 112b may be surrounded by an outer second device isolation layer 120b2, while a right side surface of the second lower active fin 112b may be surrounded by a central second device isolation layer 120b1. Also, the left side surface Sl2 of the second upper active fin 114b may protrude from the outer second device isolation layer 120b2 at a third point Hl2, while the right side surface Sr2 thereof may protrude from the central second device isolation layer 120b1 at a fourth point Hr2. As shown in FIG. 3B, the third point Hl2 and the fourth point Hr2 may be at different heights above the top surface Fs of the semiconductor substrate 101. For example, the third point Hl2 may be higher by $\Delta H$ than the fourth point Hr2. Accordingly, the second active fin 110b may be determined to have an asymmetrical structure.

In one embodiment, the second active fin 110b can be considered to have an asymmetrical structure because the second device isolation layers 120b1 and 120b2 surrounding the two side surfaces of the second lower active fin 112b have different structures. For example, the outer second device isolation layer 120b2 disposed on a left side of the second lower active fin 112b may have a different top surface profile than the central second device isolation layer 120b1, which is disposed on a right side thereof. Accordingly, the protruding third and fourth points Hl2 and Hr2 on the left side surface Sl2 and the right side surface Sr2 of the second upper active fin 114b that extends from the second lower active fin 112b along a third direction (e.g., along the "z" direction) may be at different heights above the top surface Fs of the semiconductor substrate 101.

As discussed above, when the protruding points Hl2 and Hr2 of the left side surface Sl2 and the right side surface Sr2 of the second upper active fin 114b are at different heights above the top surface Fs of the semiconductor substrate 101, the second active fin 110b can be determined to be asymmetrical. Thus, it is unnecessary to compare distances from the second center line CL2 to the protruding points Hl2 and Hr2.

Specific structures of the first device isolation layer 120a, the central second device isolation layer 120b1, and the outer second device isolation layer 120b2 will be described in further detail with reference to FIGS. 6A and 6B.

Figure 4A:
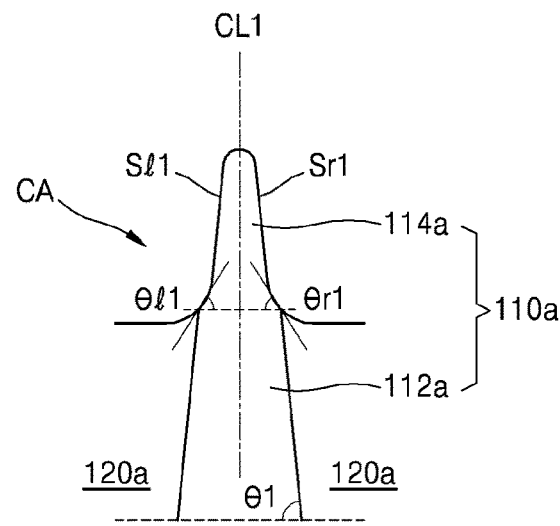
FIGS. 4A and 4B are enlarged views of regions M1 and M2 of the semiconductor device shown in FIG. 2.
Figure 4B:
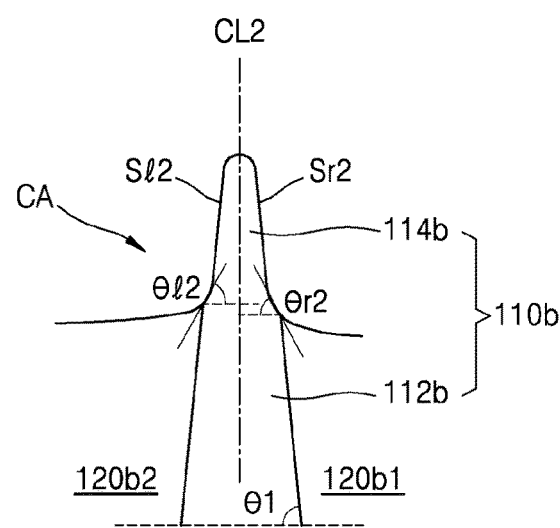
Figure 4C:
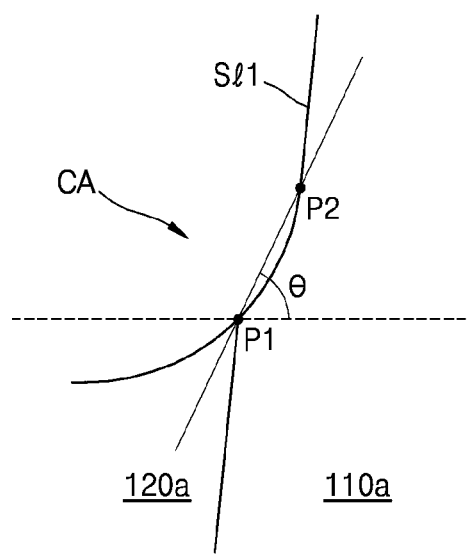
FIG. 4C is a conceptual diagram for explaining a mean inclination.

FIGS. 4A and 4B are enlarged views of regions M1 and M2 of the semiconductor device 100 shown in FIG. 2. FIG. 4C is a conceptual diagram for explaining a mean inclination.

Referring to FIG. 4A, as described above, the first active fin 110a of the first region A may include the first lower active fin 112a and the first upper active fin 114a. It may be determined whether the first active fin 110a is symmetrical by comparing mean inclinations of connection portions CA between the first lower active fin 112a and the first upper active fin 114a, as measured with respect to the top surface (refer to Fs in FIG. 2) of the semiconductor substrate (refer to 101 in FIG. 2). That is, it may be determined whether the first active fin 110a is symmetrical by comparing the mean inclinations of the connection portions CA between the left side surface Sl1 and the right side surface Sr1 of the first upper active fin 114a, as measured with respect to the top surface Fs of the semiconductor substrate 101.

For reference, as shown in FIG. 4C, a mean inclination may be defined as an angle θ formed by the top surface Fs of the semiconductor substrate 101 with a segment connecting a lower point P1 at which the first upper active fin 114a is initially exposed from the device isolation layer 120a and an upper point P2 at which a side surface of the first upper active fin 114a is changed from a straight line to a curved line. Here, since a dashed straight line is parallel to the top surface Fs of the semiconductor substrate 101, the dashed straight line may be the same standard for measuring the mean inclination as the top surface Fs of the semiconductor substrate 101. In addition, two side surfaces of the first lower active fin 112a may form a reference angle θ1 with the top surface Fs of the semiconductor substrate, and the reference angle θ1 may be greater than each of the mean inclinations of the connection portions CA as described below.

Specifically, whether or not the first active fin 110a is symmetrical can be determined based on the concept of the mean inclination of the connection portion CA as follows. The mean inclination of the connection portion CA of the left side surface Sl1 of the first upper active fin 114a may have a first angle θl1. Also, the mean inclination of the connection portion CA of the right side surface Sr1 of the first upper active fin 114a may have a second angle θr1. As shown in FIG. 4A, the first angle θl1 may be substantially equal to the second angle θr1. Accordingly, the first active fin 110a may be determined as having a symmetrical structure.

The reason why the first active fin 110a has the symmetrical structure based on the concept of the mean inclination of the connection portion CA will now be described. Similar to that described above with reference to FIG. 3A, the structure (e.g., the top surface profiles) of the first device isolation layer 120a on two side surfaces of the first active fin 110a may be substantially identical. Accordingly, it is highly likely that lower points P1 at which the first upper active fin 114a is initially exposed from the device isolation layer 120a on the left side surface Sl1 and the right side surface Sr1 of the first upper active fin 114a will be in the same position.

Since the top surface profiles of the first device isolation layer 120a on the two side surfaces of the first active fin 110a are substantially the same when the first active fin 110a has a symmetrical structure about the first center line CL1 before a recess process (refer to FIGS. 20A and 20B), it is highly likely that the left side surface Sl1 and the right side surface Sr1 of the first upper active fin 114a will have identical profiles during the recess process for making the first upper active fin 114a protrude. Accordingly, it is highly likely that upper points P2 on the left side surface Sl1 and the right side surface Sr1 of the first upper active fin 114a will be in the same position As a result, the positions of the lower point P1 and the upper point P2, relative to the left side surface Sl1 of the first upper active fin 114a, may be the same as respectively positions of the lower point P1 and the upper point P2, relative to the right side surface Sr1 of the first upper active fin 114a. Thus, the mean inclinations of the left side surface Sl1 and right side surface Sr1 of the first upper active fin 114a may be identical, and the first active fin 110a may be determined to have a symmetrical structure.

In addition, as described with reference to FIG. 3A, even if the mean inclinations of the left side surface Sl1 and right side surface Sr1 of the first upper active fin 114a are identical, distances from the first center line CL1 to the respective lower points P1 or upper points P2 may be further compared to each other to increase the precision with which the first upper active fin 114a is determined to be symmetrical.

Referring to FIG. 4B, as described above, the second active fin 110b of the second region B may include the second lower active fin 112b and the second upper active fin 114b. It may be determined whether the second active fin 110b is asymmetrical, based on the above-described mean inclinations of the connection portions CA as follows.

The mean inclination of the connection portion CA of the left side surface Sl2 of the second upper active fin 114b may have a third angle θl2. Also, the mean inclination of the connection portion CA of the right side surface Sr2 of the second upper active fin 114b may have a fourth angle θr2. As shown in FIG. 4B, the third angle θl2 may differ from the fourth angle θr2. That is, the third angle θl2 may be less than the fourth angle θr2. Accordingly, the second active fin 110b may be determined as having an asymmetrical structure.

The reason why the second active fin 110b has the asymmetrical structure may be analyzed based on the concept of the mean inclination of the connection portion CA. Initially, as described above with reference to FIG. 3B, the second device isolation layers 120b1 and 120b2 may have different structures. For example, the outer second device isolation layer 120b2 and the central second device isolation layer 120b1 have different top surface profiles and, as a result, protruding points of the left side surface Sl2 and the right side surface Sr2 of the second upper active fin 114b may be different. For example, a lower point P1 on the left side surface Sl2 of the second upper active fin 114b may be higher than a lower point P1 on the right side surface Sr2 of the second upper active fin 114b.

Next, and assuming that the second active fin 110b has a symmetrical structure about the second center line CL2 before a recess process, the left side surface Sl2 and the right side surface Sr2 of the second upper active fin 114b may also have similar profiles to each other during a recess process for making the second upper active fin 114b protrude. Thus, upper points P2 on the left side surface Sl2 and the right side surface Sr2 of the second upper active fin 114b may be in similar positions to each other. Accordingly, since the lower point P1 on the left side surface Sl2 is in a higher position than the lower point P1 on the right side surface Sr2, the mean inclination of the connection portion CA of the left side surface Sl2 may be less than the mean inclination of the connection portion CA of the right side surface Sr2.

Figure 6A:
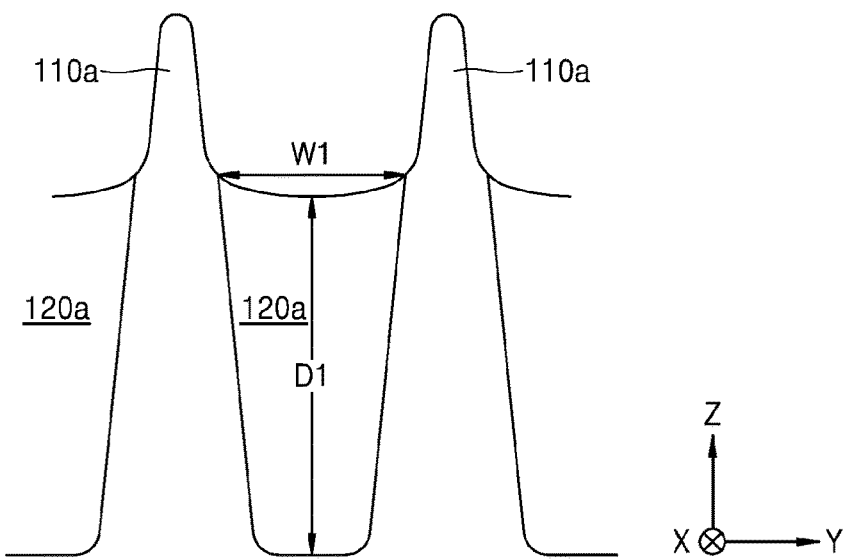
FIGS. 6A and 6B are enlarged views of a first device isolation layer and an outer second device isolation layer of the semiconductor device shown in FIG. 2.
Figure 6B:
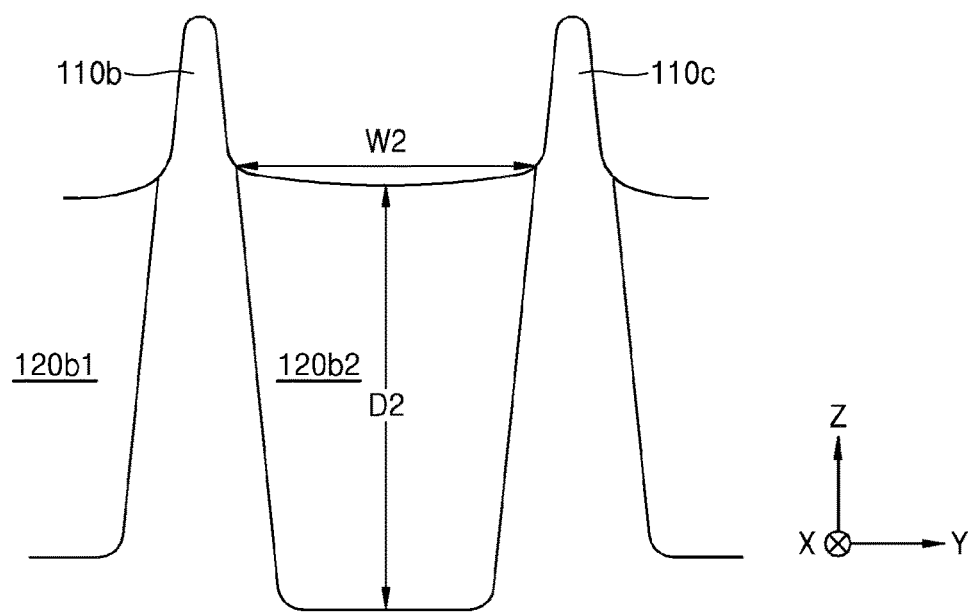

In addition, as can be seen from FIGS. 2 and 6B, since the outer second device isolation layer 120b2 has a greater width than the central second device isolation layer 120b1, the left side surface Sl2 of the second upper active fin 114b may be etched more than the right side surface Sr2 thereof so that the upper point P2 on the left side surface Sl2 may be in a lower position than the upper point P2 on the right side surface Sr2. As a result, the mean inclination of the connection portion CA of the left side surface Sl2 of the second upper active fin 114b may be less than the mean inclination of the connection portion CA of the right side surface Sr2 thereof.

For reference, two side surfaces of the second lower active fin 112b may have a reference angle θ1, as measured with respect to the top surface (refer to Fs in FIG. 2) of the semiconductor substrate (refer to 101 in FIG. 2), and the reference angle θ1 may be higher than each of the mean inclinations of the connection portions CA. Also, the reference angle θ1 of the second lower active fin 112b may be substantially equal to the reference angle θ1 of the first lower active fin 112a.

As discussed above, the second active fin 110b can be determined as being asymmetrical when the mean inclinations of the connection portions CA of the left side surface Sl2 and right side surface Sr2 of the second upper active fin 114b are different from each other. Accordingly, it is unnecessary to compare distances from the second center line CL2 to the lower points P1 or the upper points P2.

Figure 5A:
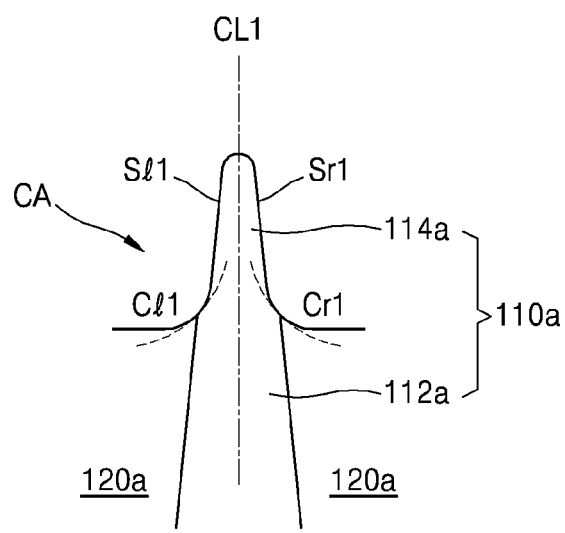
FIGS. 5A and 5B are enlarged views of regions M1 and M2 of the semiconductor device shown in FIG. 2.
Figure 5B:
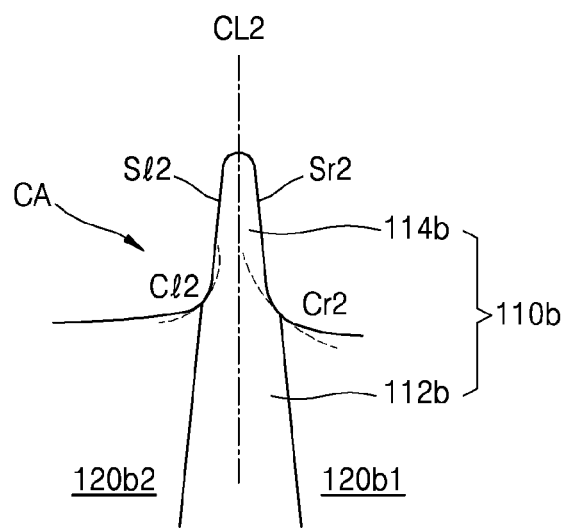
Figure 5C:
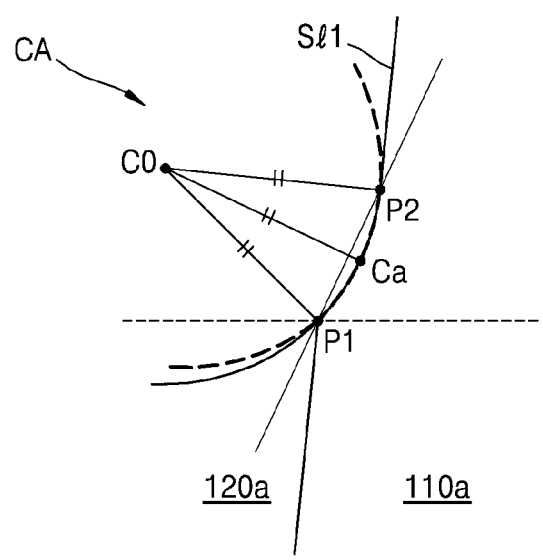
FIG. 5C is a conceptual diagram for explaining a mean curvature.

FIGS. 5A and 5B are enlarged views of regions M1 and M2 of the semiconductor device 100 shown in FIG. 2, and FIG. 5C is a conceptual diagram for explaining a mean curvature.

Referring to FIG. 5A, whether or not the first active fin 110a is symmetrical can be determined by comparing mean curvatures or mean radii of curvature of connection portions CA between the first lower active fin 112a and the first upper active fin 114a. For example, mean curvatures or mean radii of curvature of connection portions CA of the left side surface Sl1 and the right side surface Sr1 of the first upper active fin 114a can be compared to determine whether the first active fin 110a is symmetrical. As the reader will appreciate, measurements of curvature and radius of curvature have a reciprocal relationship, so that a large curvature corresponds to a small radius of curvature, and vice versa. For example, a straight line has a curvature of 0, but has an infinite radius of curvature.

A process of determining whether the first active fin 110a is symmetrical based on the concept of the mean curvature of the connection portion CA will now be described. The connection portion CA of the left side surface Sl1 of the first upper active fin 114a may have a first curvature Cl1, and the connection portion CA of the right side surface Sr1 of the first upper active fin 114a may have a second curvature Cr1. As shown in FIG. 5A, the first curvature Cl1 may be substantially equal to the second curvature Cr1. Accordingly, the first active fin 110a may be determined to have a symmetrical structure.

It may be difficult to define each of the connection portions CA of the left side surface Sl1 and the right side surface Sr1 of the first upper active fin 114a a single curvature measurement. Accordingly, although each of the connection portions CA of the left side surface Sl1 and the right side surface Sr1 of the first upper active fin 114a has a curved shape, each of the connection portions CA of the left side surface Sl1 and the right side surface Sr1 of the first upper active fin 114a may be defined by the sum of curved lines having various curvature measurements instead of one curvature measurement. Accordingly, the concept of a "mean curvature" may be adopted in a manner similar to concept of the mean inclination.

The concept of the mean curvature will now be described in detail. As shown in FIG. 5C, it may be assumed that the lower point P1 and the upper point P2, described previously in the context of determining a mean inclination, are two end points of an arc. In one embodiment, the mean curvature may be determined based on one point on the connection portion CA (i.e., an "arc central point Ca"), which corresponds to a center of a segment connecting the lower point P1 and the upper point P2, and another point (i.e., a "central point C0"), which is approximately equidistant between the lower point P1, the upper point P2, and the arc central point Ca. Given the definitions above, the mean distance from the central point C0 to each of the lower point P1, the upper point P2, and the arc central point Ca may be defined as the mean radius of curvature, and the reciprocal of the mean radius of curvature may be defined as the mean curvature.

The reason why the first active fin 110a has the symmetrical structure based on the concept of the mean curvature of the connection portion CA may be similar to the reason described above based on the mean inclination. That is, when the aforementioned lower and upper points P1 and P2 are measured, the arc central point Ca may be easily determined. Also, when respective ones of the lower and upper points P1 and P2 on the connection portions CA of the left side surface Sl1 and right side surface Sr1 of the first upper active fin 114a are at the same height, it is highly likely that the connection portion CA of the left side surface Sl1 may have about the same shape as the connection portion CA of the right side surface Sr1. Thus, the connection portion CA of the left side surface Sl1 may have about the same mean curvature as the connection portion CA of the right side surface Sr1.

In one embodiment, even if the lower and upper points P1 and P2 on the connection portion CA of the left side surface Sl1 of the first upper active fin 114a are at the same height as the lower and upper points P1 and P2 on the connection portion CA of the right side surface Sr1 thereof, the connection portion CA of the left side surface Sl1 may have a different shape from the connection portion CA of the right side surface Sr1. In this case, a mean curvature of the connection portion CA of the left side surface Sl1 may be different from a mean curvature of the connection portion CA of the right side surface Sr1. For example, if the lower and upper points P1 and P2 on the connection portion CA of the left side surface Sl1 of the first upper active fin 114a are at the same height as the lower and upper points P1 and P2 on the connection portion CA of the right side surface Sr1 thereof, the arc central point Ca on any one of the connection portions CAs of the left and right side surfaces Sl1 and Sr2 is located in an inwardly deeper position than the arc central point Ca on the other one thereof. Thus, the connection portion CA on which the arc central point Ca is located in the inwardly deep position may have a larger curvature than the other connection portion CA.

In addition, as described above with reference to FIG. 3A, even if the mean curvature of the connection portion CA of the left side surface Sl1 of the first upper active fin 114a is equal to the mean curvature of the connection portion CA of the right side surface Sr1 thereof, distances from the first center line CL1 to the lower points P1 or the upper points P2 may be further compared to each other to increase the precision with which the first upper active fin 114a is determined to be symmetrical.

Referring to FIG. 5B, whether or not the second active fin 110b is asymmetrical can be determined based on the above-described mean curvature of the connection portion CA.

For example, the connection portion CA of the left side surface Sl2 of the second upper active fin 114b may have a third curvature Cl2 and the connection portion CA of the right side surface Sr2 of the second upper active fin 114b may have a fourth curvature Cr2. As shown in FIG. 5B, the third curvature Cl2 may be different from (e.g., be greater than) the fourth curvature Cr2. Accordingly, the second active fin 110b may be determined to have an asymmetrical structure.

The reason why the second active fin 110b has the asymmetrical structure based on the concept of the mean curvature of the connection portion CA may be inferred from the descriptions of the mean inclination with reference to FIG. 4B, and thus detailed descriptions thereof are omitted.

When the mean curvature of the connection portion CA of the left side surface Sl2 of the second upper active fin 114b is different from the mean curvature of the connection portion CA of the right side surface Sr2 thereof, since the second active fin 110b is already determined as being asymmetrical, it is unnecessary to consider comparing distances from the second center line CL2 to the lower points P1 or the upper points P2.

FIGS. 6A and 6B are enlarged views of a first device isolation layer 120a and an outer second device isolation layer 120b2 of the semiconductor device 100 shown in FIG. 2. Specifically, FIG. 6A shows the first device isolation layer 120a interposed between two first active fins 110a in the first region A of the semiconductor substrate 101, and FIG. 6B shows the outer second device isolation layer 120b2 in the second region B of the semiconductor substrate 101.

Referring to FIGS. 6A and 6B, the first device isolation layer 120a may be disposed between two first active fins 110a, the outer second device isolation layer 120b2 may be disposed on the right side of the second active fin 110b and the central second device isolation layer 120b1 may be disposed on the left side of the second active fin 110b. For purposes of discussion herein, when referring to the semiconductor device 100 shown in FIG. 1 or 2, the second active fin 110b may correspond to the second active fin 110b disposed on the right side of the second region B.

The first device isolation layer 120a may have a first width W1 along a second direction (e.g., along a "y" direction), and the outer second device isolation layer 120b2 may have a second width W2 in the second direction (y direction). The second width W2 may be greater than the first width W1. For example, the second width W2 may be twice as great as the first width W1, but the second width W2 and the first width W1 are not limited thereto. For example, the second width W2 may be less or more than twice the first width W1.

Meanwhile, the first device isolation layer 120a may have a first depth D1 in a third direction (e.g., in the "z" direction), and the outer second device isolation layer 120b2 may have a second depth D2 in the third direction (e.g., in the "z" direction). The second depth D2 may be greater than the first depth D1. However, in some cases, the second depth D2 may be equal to or less than the first depth D1.

Meanwhile, the first device isolation layer 120a and the outer second device isolation layer 120b2 may have different top surface profiles. For example, a top surface of the first device isolation layer 120a may have a larger curvature than a top surface of the outer second device isolation layer 120b2 and a concave structure. Thus, it may be inferred that the first device isolation layer 120a has a relatively small width in the second direction and a space between the two first active fins 110a is relatively narrow so that a large amount of etchant may reach a central portion of the first device isolation layer 120a and the central portion of the first device isolation layer 120a may be largely etched during a recess process for making the first upper active fin 114a protrude. In an edge portion of the first device isolation layer 120a, the etchant may reach a side surface of the first active fin 110a earlier than the first device isolation layer 120a, and etch the side surface of the first active fin 110a so that an inclination of a side surface of the first upper active fin 114a may be relatively large. For this reason, a point at which the first upper active fin 114a protrudes from the first device isolation layer 120a may be relatively low, and the connection portion C of the first upper active fin 114a may have an relatively large mean inclination (corresponding to a relatively small mean curvature).

In contrast, since the outer second device isolation layer 120b2 has a relatively large width in the second direction, the entire top surface of the outer second device isolation layer 120b2 may be uniformly etched so that a top surface of the outer second device isolation layer 120b2 may have a relatively smaller curvature than a top surface of the first device isolation layer 120a, and may also have a concave structure. For example, the top surface of the outer second device isolation layer 120b2 may have a somewhat flat shape. Thus, an edge portion of the top surface of the outer second device isolation layer 120b2 and a side surface of the second upper active fin 114b may be connected at a relatively large curvature. Accordingly, a point at which the second upper active fin 114b protrudes from the outer second device isolation layer 120b2 may be relatively high. Also, the connection portion CA of the second upper active fin 114b near the outer second device isolation layer 120b2 may have a relatively small mean inclination (corresponding to a relatively large mean curvature. A variation in a top surface profile of the device isolation layers 120a, 120b1, and 120b2 according to distances among the device isolation layers 120a, 120b1, and 120b2 during an etching process may be referred to as a loading effect.

As described above, the central second device isolation layer 120b1 may be disposed on the left side of the second active fin 110b, and a structure of the central second device isolation layer 120b1 may be almost similar to that of the first device isolation layer 120a. Accordingly, the connection portion CA of the second active fin 110b bordering the central second device isolation layer 120b1 may have an almost similar structure to that of the connection portion CA of the first active fin 110a. However, in some cases, the central second device isolation layer 120b1 may have a different structure from the first device isolation layer 120a. In this case, the connection portion CA of the second active fin 110b bordering the central second device isolation layer 120b1 may have a different structure from the connection portion CA of the first active fin 110a. As a result, structures of the connection portions CA of the active fins 110a and 110b may vary depending upon the structure of the device isolation layer that they border, particularly, a width of the device isolation layer along a second direction (e.g., along a "y" direction). Variations in the top surface profile of the device isolation layer and side structures of the active fins 110a and 110b according to the width of the device isolation layer during an etching process may be referred to as a loading effect.

In FIG. 6B, an active fin 110c disposed on the right side may not be an active fin disposed in the second region B of the semiconductor device 100 shown in FIG. 1 or 2. For example, the right active fin 110c may be an active fin disposed in an outermost portion of another first region, an active fin disposed in another second region, or an active fin disposed in a third region including one active fin. Here, the first region, the second region, and the third region may be distinguished from one another as follows. The first region may be a region in which at least three active fins are disposed, the second region may be a region in which two active fins are disposed, and the third region may be a region in which only one active fin is disposed. Structures of the first, second, and third regions and active fins disposed therein will be described in further detail later with reference to FIG. 10.

Figure 7:
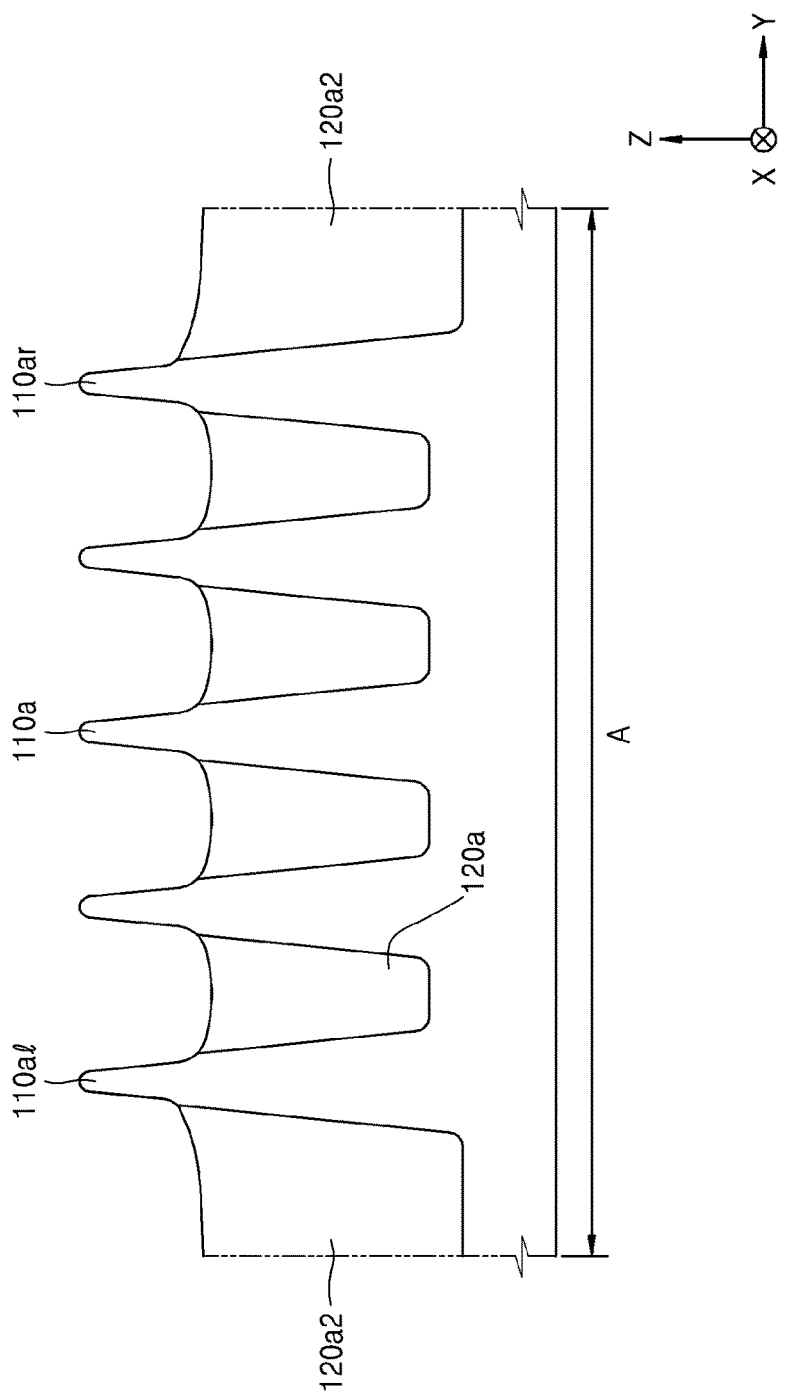
FIG. 7 is a cross-sectional view of outermost active fins of a first region of the semiconductor device shown in FIG. 2.

FIG. 7 is a cross-sectional view of outermost active fins of the first region A of the semiconductor device 100 shown in FIG. 2.

Referring to FIG. 7, an outer first device isolation layer 120a2 may be disposed in an outermost portion of the first region A. For example, the outer first device isolation layer 120a2 may have a similar structure to the outer second device isolation layer 120b2 of the second region B. Thus, the outer first device isolation layer 120a2 may have a greater width along the second direction (e.g., in the "y" direction) than the first device isolation layer 120a and have a greater depth in the third direction (or z direction) than the first device isolation layer 120a.

Also, first active fins 110al and 110ar disposed in the outermost portion of the first region A may have asymmetrical structures, unlike first active fins 110a disposed in the center of the first region A between first active fins 110al and 110ar. For example, a first active fin 110al disposed in a left outermost portion of the first region A may have a structure corresponding to a left second active fin 110b of the second region B, while a first active fin 110ar disposed in a right outermost portion of the first region A may have a structure corresponding to a right second active fin 110b of the second region B.

Thus, a left side surface of the first active fin 110al disposed in the left outermost portion of the first region A may protrude at a higher point than a protruding point of a right side surface thereof. Also, a connection portion CA of the left side surface of the first active fin 110al disposed in the left outermost portion may have a smaller mean inclination and a larger mean curvature than a connection portion CA of the right side surface thereof. Furthermore, the first active fin 110ar disposed in the right outermost portion of the first region A may have an opposite structure from that of the first active fin 110al disposed in the left outermost portion thereof.

FIG. 8 is a cross-sectional view of a semiconductor device 100a according to an exemplary embodiment, which corresponds to the cross-sectional view of the semiconductor device 100 shown in FIG. 2. The same descriptions as in FIGS. 1 and 2 are simplified or omitted for brevity.

Referring to FIG. 8, the semiconductor device 100a according to the present embodiment may differ from the semiconductor device 100 shown in FIGS. 1 and 2 in that the semiconductor device 100a includes a third region A1 instead of a first region A. A second region B and a device isolation layer 120b1 and 120b2 and a second active fin 110b disposed in the second region B are the same as in the semiconductor device 100 shown in FIGS. 1 and 2. For reference, the third region is denoted by reference numeral 'A1' because an active fin disposed in the third region has a symmetrical structure. For the same reason, the active fin disposed in the third region A1 is called a first active fin 110a1.

The third region A1 may include one first active fin 110a1, and two side surfaces of a lower portion of the first active fin 110a1 may be surrounded by an outer first device isolation layer 120a2. Specifically, the first active fin 110a1 may include a first lower active fin 112a1 and a first upper active fin 114a1. Two side surfaces of the first lower active fin 112a1 may be surrounded by the outer first device isolation layer 120a2. The first upper active fin 114a1 may protrude from the outer first device isolation layer 120a2.

The first active fin 110a1 may have a symmetrical structure about a third center line CL3. The first active fin 110a1 may have the symmetrical structure because the outer first device isolation layers 120a2 disposed on the two side surfaces of the first active fin 110a1 have the same structure. This fact is similar to the fact that the first active fin 110a of the first region A may have a symmetrical structure because the first device isolation layers 120a disposed on the two side surfaces of the first active fin 110a have the same structure. The symmetrical structure of the first active fin 110a1 will be described in further detail with reference to FIGS. 9A to 9C.

Figure 9A:
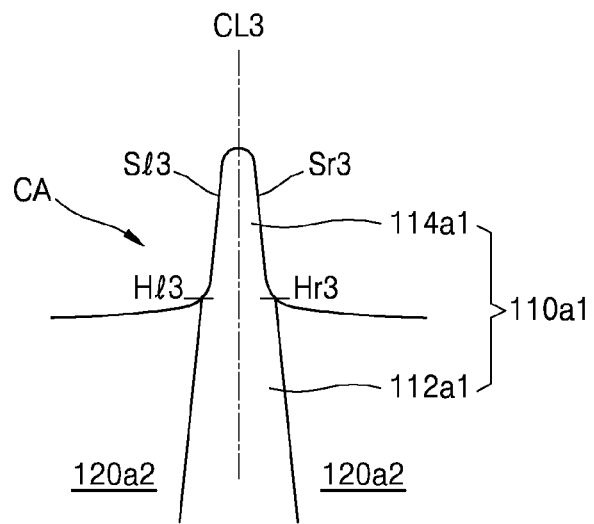
FIGS. 9A to 9C are enlarged views of a region M3 of the semiconductor device shown in FIG. 8.
Figure 9B:
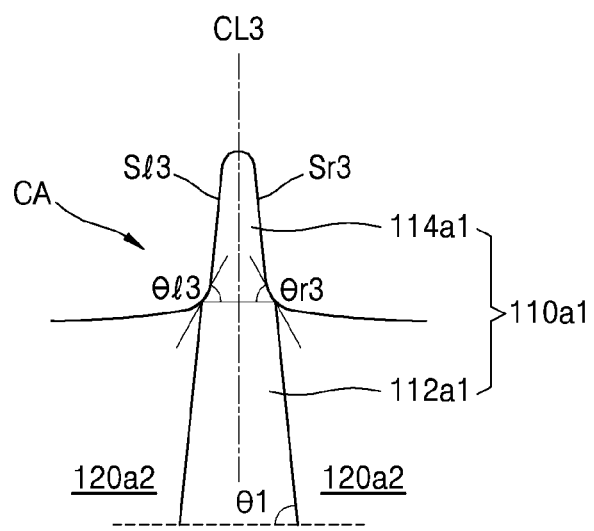
Figure 9C:
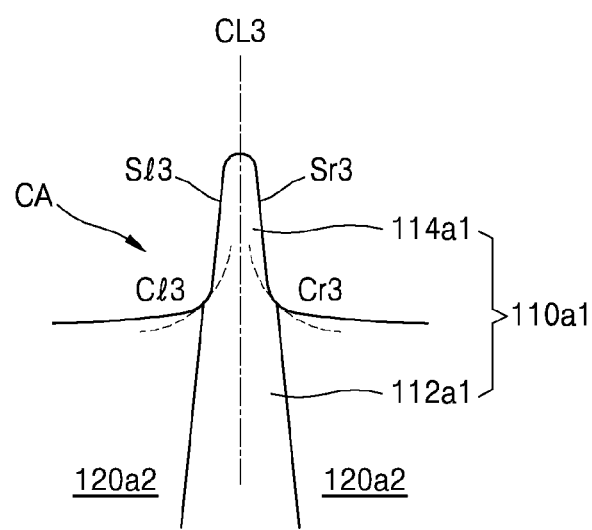

FIGS. 9A to 9C are enlarged views of a region M3 of the semiconductor device 100a shown in FIG. 8.

Referring to FIG. 9A, the first active fin 110a1 of the third region A1 may include a first lower active fin 112a1 having two side surfaces surrounded by the outer first device isolation layer 120a2 and a first upper active fin 114a1 protruding from the outer first device isolation layer 120a2. Whether or not the first active fin 110a1 is symmetrical can be determined by comparing points at which a left side surface Sl3 and a right side surface Sr3 of the first upper active fin 114a1 protrude from the outer first device isolation layer 120a2.

For example, both the left side surface Sl3 and the right side surface Sr3 of the first upper active fin 114a1 protrude from the outer first device isolation layer 120a2. The left side surface Sl3 may protrude from the outer first device isolation layer 120a2 at a fifth point Hl3 above the top surface Fs of the semiconductor substrate 101, and the right side surface Sr3 may protrude from the outer first device isolation layer 120a2 at a sixth point Hr3 above the top surface Fs of the semiconductor substrate 101. As shown in FIG. 9A, the fifth point Hl3 may be at the same height above the top surface Fs of the semiconductor substrate 101 as the sixth point Hr3. Accordingly, the first active fin 110a1 may be determined have a symmetrical structure.

The first active fin 110a1 may have the symmetrical structure for the same reasons as discussed relative to the first active fin 110a shown in FIG. 3A has the symmetrical structure. Specifically, the first active fin 110a1 has the symmetrical structure because the outer first device isolation layers 120a2 surrounding two side surfaces of the first active fin 110a1 have substantially identical structures.

In addition, as described with reference to FIG. 3A, even if the protruding points Hl3 and Hr3 of the left side surface Sl3 and the right side surface Sr3 of the first upper active fin 114a1 are at identical heights above the top surface Fs of the semiconductor substrate 101, distances from a third center line CL3 to the protruding points Hl3 and Hr3 may be further compared to each other to increase the precision with which the first upper active fin 114a1 is determined to be symmetrical.

Referring to FIG. 9B, whether or not the first active fin 110a1 is symmetrical may be determined by comparing mean inclinations of connection portions CA between the first lower active fin 112a1 and the first upper active fin 114a1, as measured with respect to the top surface (refer to Fs in FIG. 2) of the semiconductor substrate (refer to 101 in FIG. 2). Here, the concept of the mean inclination may be the same as described with reference to FIGS. 4A and 4B. A side surface of the first lower active fin 112a1 may have a reference angle θ1, as measured with respect to the top surface of the semiconductor substrate 101, which may be greater than each of the mean inclinations of the connection portions CA as described below.

For example, a mean inclination of a connection portions CA of the left side surface Sl3 and the right side surface Sr3 of the first upper active fin 114a1 may have a fifth angle θl3 and a sixth angle θr3, respectively. As shown in FIG. 9B, the fifth angle θl3 may be substantially equal to the sixth angle θr3. Accordingly, the first active fin 110a1 may be determined as having a symmetrical structure.

Since the reason why the first active fin 110a1 has the symmetrical structure based on the concept of the mean inclination of the connection portion CA is the same as the reason that the first active fin 110a shown in FIG. 4A has the symmetrical structure, descriptions thereof are omitted. In addition, as described above with reference to FIG. 3A, even if the connection portions CA of the left side surface Sl3 and the right side surface Sr3 of the first upper active fin 114a1 have the same mean inclination, distances from the third center line CL3 to respective lower points P1 or upper points P2 may be further compared to each other to increase the precision with which the first upper active fin 114a1 is determined to be symmetrical.

Referring to FIG. 9C, whether or not the first active fin 110a1 is symmetrical may be determined by comparing mean curvatures or mean radii of curvature of the connection portions CA between the first lower active fin 112a1 and the first upper active fin 114a1. Here, the concept of the mean curvature is the same as described above with reference to FIGS. 5A and 5B.

For example, the connection portions CA of the left side surface Sl3 and the right side surface Sr3 of the first upper active fin 114a1 may have a fifth curvature Cl3 and a sixth curvature Cr3, respectively. As shown in FIG. 9C, the fifth curvature Cl3 may be substantially equal to the sixth curvature Cr3. Accordingly, the first active fin 110a1 may be determined as having a symmetrical structure.

Since the reason why the first active fin 110a1 has the symmetrical structure based on the concept of the mean curvature of the connection portion CA is the same as the reason why the first active fin 110a shown in FIG. 5A has the symmetrical structure, descriptions thereof are omitted. In addition, as described with reference to FIG. 3A, even if the connection portions CA of the left side surface Sl3 and the right side surface Sr3 of the first upper active fin 114a1 have the same mean curvature, distances from the third center line CL3 to respective lower points P1 or upper points P2 may be further compared to each other to increase the precision with which the first upper active fin 114a1 is determined to be symmetrical.

Figure 10:
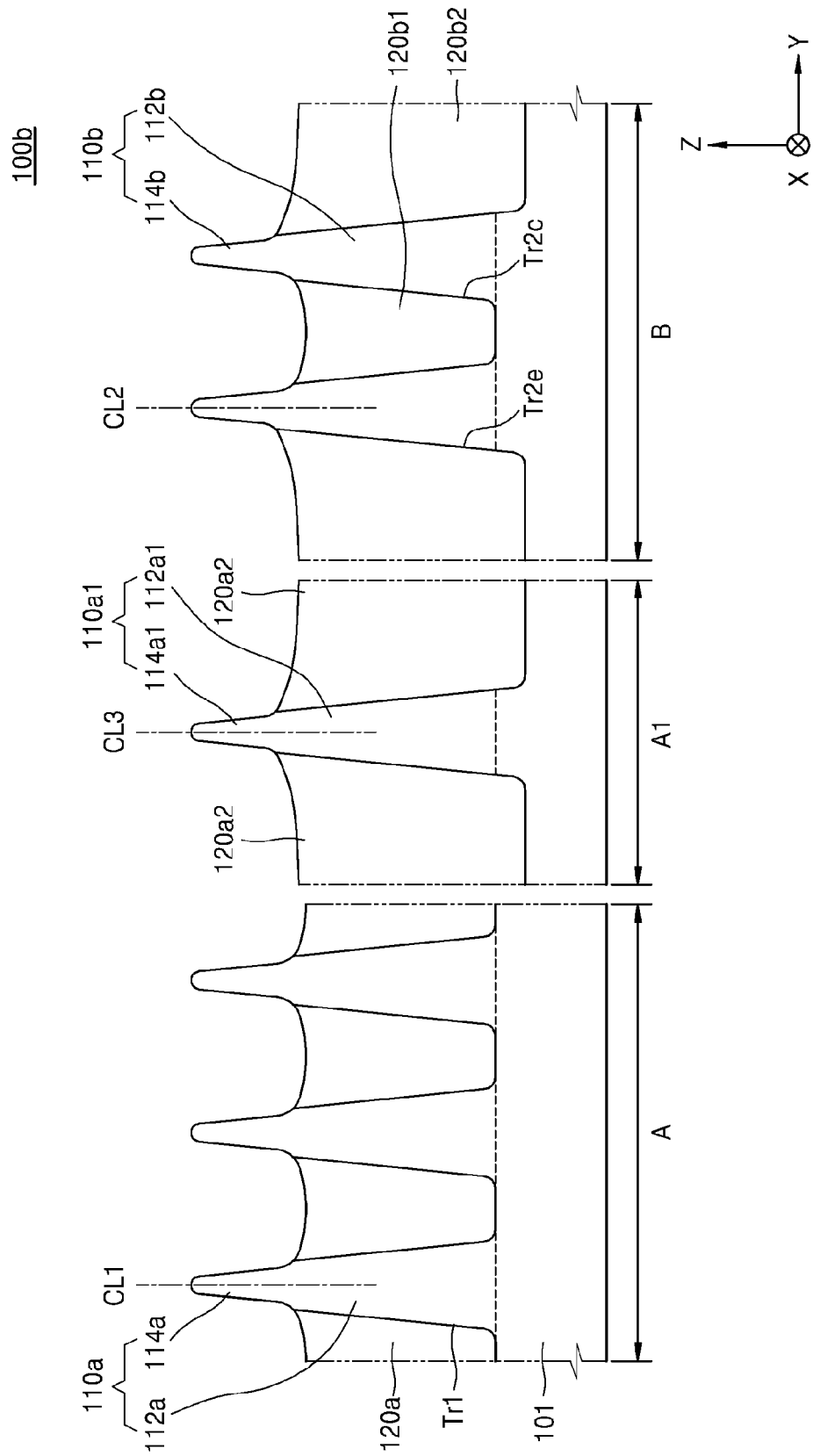
FIG. 10 is a cross-sectional view of a semiconductor device according to an exemplary embodiment, which corresponds to the cross-sectional view of the semiconductor device shown in FIG. 2.

FIG. 10 is a cross-sectional view of a semiconductor device 100b according to an exemplary embodiment, which corresponds to the cross-sectional view of the semiconductor device 100 shown in FIG. 2. The same descriptions as in FIGS. 1, 2, and 8 are simplified or omitted here for brevity.

Referring to FIG. 10, the semiconductor device 100b according to the present embodiment may differ from the semiconductor device 100 shown in FIGS. 1 and 2 in that the semiconductor device 100b further includes a third region A1. For example, the semiconductor device 100b according to the present embodiment may include a first region A, a second region B, and a third region A1 disposed on a semiconductor substrate 101.

At least three first active fins 110a may be disposed in the first region A. Each of the first active fins 110a may include a first lower active fin 112a having two side surfaces surrounded by a first device isolation layer 120a and a first upper active fin 114a protruding from the first device isolation layer 120a. The first active fin 110a may have a symmetrical structure because the first device isolation layer 120a disposed on the two side surfaces of the first active fins 110a have the same structure.

Two second active fins 110b may be disposed in the second region B, and each of the second active fins 110b may include a second lower active fin 112b having two side surfaces surrounded by a second device isolation layer 120b1 and 120b2 and a second upper active fin 114b protruding from the second device isolation layer 120b1 and 120b2. More specifically, one side surface of the second lower active fin 112b of the second active fin 110b may be surrounded by a central second device isolation layer 120b1, while another side surface thereof may be surrounded by an outer second device isolation layer 120b2. The central second device isolation layer 120b1 and the outer second device isolation layer 120b2 may have different structures, for example, different top profiles. Thus, the second active fin 110b may have an asymmetrical structure.

Specific descriptions of the first region A, the second region B, the first active fin 110a and the first device isolation layer 120a of the first region A, and the second active fin 110b and the second device isolation layer 120b1 and 120b2 of the second region B are the same as in the semiconductor device 100 shown in FIGS. 1 and 2.

One first active fin 110a1 may be disposed in the third region A1, and the first active fin 110a1 may include a first lower active fin 112a1 having two side surfaces surrounded by an outer first device isolation layer 120a2 and a first upper active fin 114a1 protruding from the outer first device isolation layer 120a2. The first active fin 110a1 may have a symmetrical structure due to the fact that the outer first device isolation layers 120a2 disposed on the two side surfaces of the first lower active fin 112a have the same structure.

In addition, a left side surface of the first active fin 110a1 may have substantially the same profile as a left side surface of the second active fin 110b on the left side of the second region B, and a right side surface of the first active fin 110a1 may have substantially the same profile as a right side surface of the second active fin 110b on the right side of the second region B. This may be due to the fact that the outer first device isolation layers 120a2 surrounding the two side surfaces of the first lower active fin 112a1 have substantially the same structure as the outer second device isolation layer 120b2 surrounding any one side surface of the second lower active fin 112b.

However, a side profile of the first active fin 110a1 may not be necessarily related to a side profile of the second active fin 110b. For example, the outer first device isolation layer 120a2 may have a different structure from the outer second device isolation layer 120b2. Thus, the side profile of the first active fin 110a1 may have absolutely nothing to do with the side profile of the second active fin 110b. Also, even if the outer first device isolation layer 120a2 has the same structure as the outer second device isolation layer 120b2, the side profile of the first active fin 110a1 may have a different structure from the side profile of the second active fin 110b.

Specific descriptions of the third region A1 and the first active fin 110a1 and the outer first device isolation layer 120a2 of the third region A1 are the same as in the semiconductor device 100a shown in FIG. 8. In addition, although the third region A1 is disposed between the first region A and the second region B, a position of the third region A1 is not limited thereto. For instance, the first region A may be disposed between the third region A1 and the second region B. Alternatively, the second region B may be disposed between the first region A and the third region A1.

Figure 11:
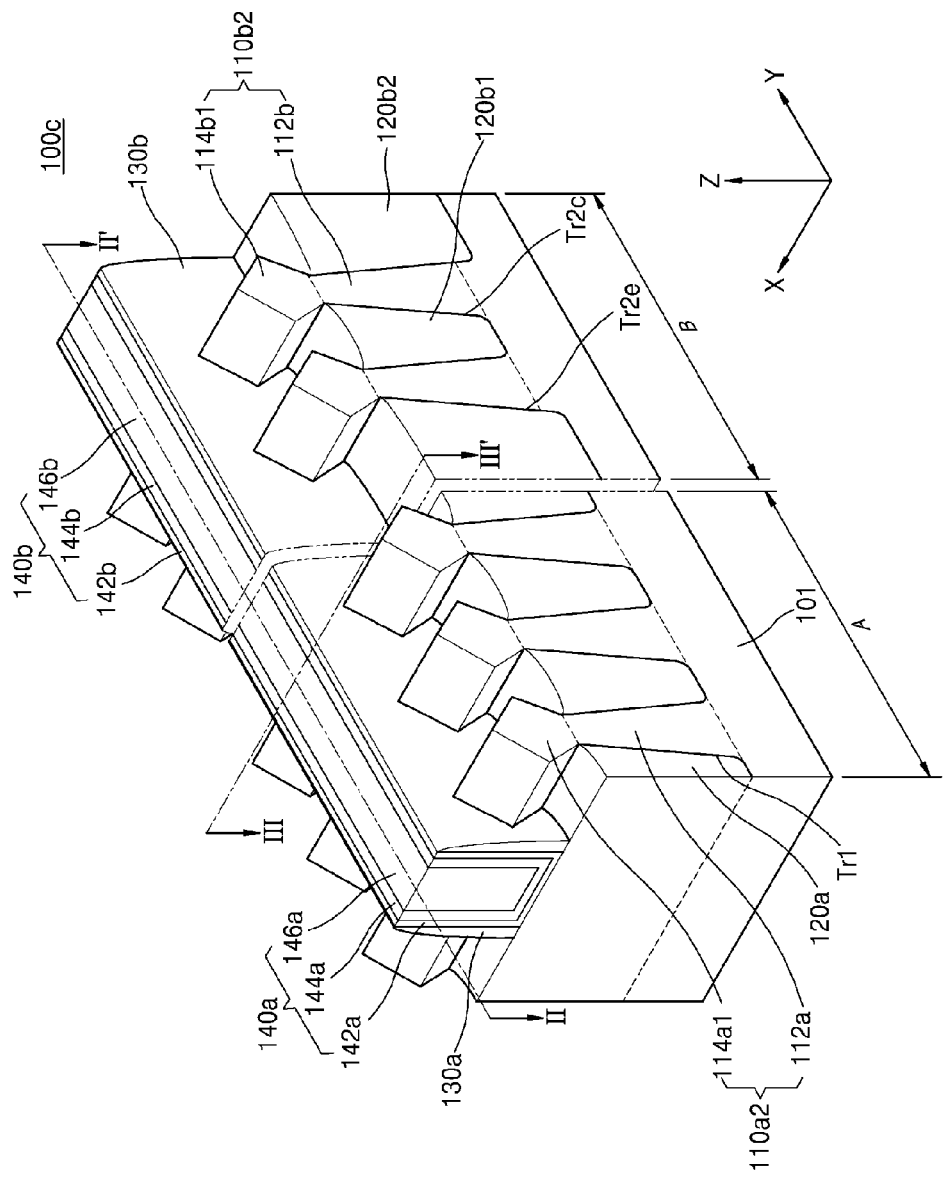
FIG. 11 is a perspective view of a semiconductor device according to an exemplary embodiment.
Figure 12A:
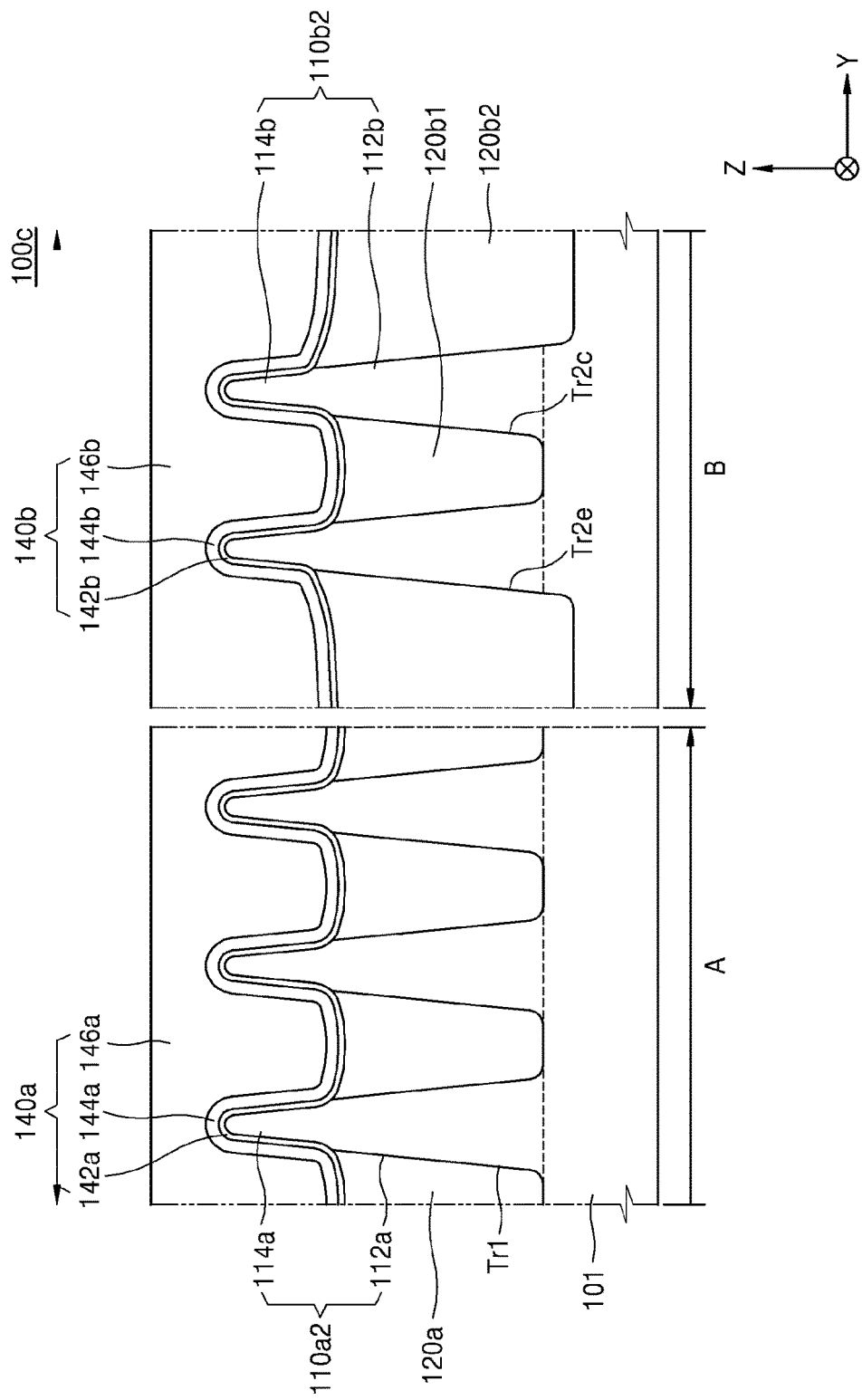
FIG. 12A is a cross-sectional view taken along a portion II-II' of the semiconductor device shown in FIG. 11.
Figure 12B:
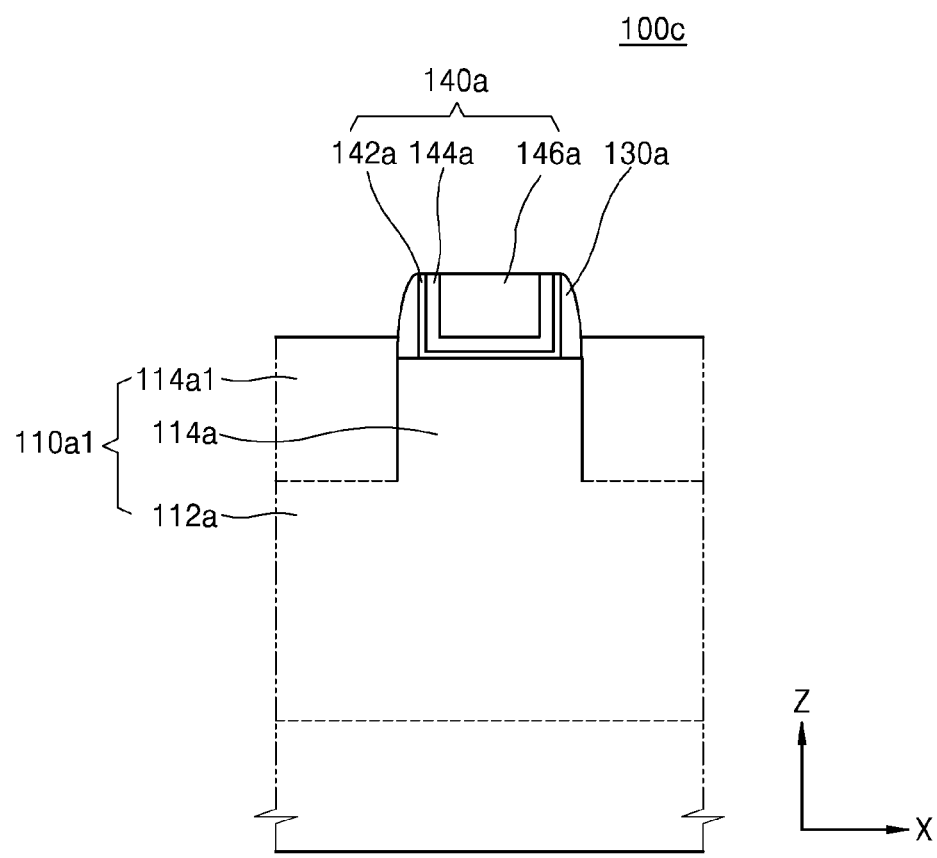
FIG. 12B is a cross-sectional view taken along a portion III-III' of the semiconductor device shown in FIG. 11.

FIG. 11 is a perspective view of a semiconductor device 100c according to an exemplary embodiment. FIG. 12A is a cross-sectional view taken along a line II-II of the semiconductor device 100c shown in FIG. 11. FIG. 12B is a cross-sectional view taken along a line of the semiconductor device 100c shown in FIG. 11. The same descriptions as in FIGS. 1 and 2 are simplified or omitted for brevity.

Referring to FIGS. 11 to 12B, the semiconductor device 100c according to the present embodiment may differ from the semiconductor device 100 shown in FIGS. 1 and 2 in terms of structures of active fins disposed on two side surfaces of gate structures 140a and 140b. In addition, the semiconductor device 100c according to the present embodiment may include the gate structures 140a and 140b. Naturally, the gate structures 140a and 140b may be included in the semiconductor device 100 shown in FIGS. 1 and 2, the semiconductor device 100a shown in FIG. 8, and the semiconductor device 100b shown in FIG. 10.

Specifically, similar to the semiconductor device 100 shown in FIGS. 1 and 2, the semiconductor device 100c according to the present embodiment may include a first region A and a second region B disposed on a semiconductor substrate 101. Thus, a first active fin 110a2 and a first device isolation layer 120a may be disposed in the first region A, and a second active fin 110b2 and a second device isolation layer 120b1 and 120b2 may be disposed in the second region B.

Descriptions of the first region A, the second region B, the first device isolation layer 120a of the first region A, and the second device isolation layer 120b1 and 120b2 of the second region B may be the same as in the semiconductor device 100 shown in FIGS. 1 and 2.

Meanwhile, the active fins 110a2 and 110b2 may include lower active fins 112a and 112b, upper active fins 114a and 114b, and epi-upper active fins 114a1 and 114b1, respectively. Specifically, the first active fin 110a2 may include a first lower active fin 112a, a first upper active fin 114a, and a first epi-upper active fin 114a1, and the second active fin 110b2 may include a second lower active fin 112b, a second upper active fin 114b, and a second epi-upper active fin 114b1.

Descriptions of the lower active fins 112a and 112b and the upper active fins 114a and 114b are the same as in the semiconductor device 100 shown in FIGS. 1 and 2. However, the upper active fins 114a and 114b may be disposed only on lower portions of the gate structures 140a and 140b, and the epi-upper active fins 114a1 and 114b1 may be disposed outside two side surfaces of the gate structures 140a and 140b instead of the upper active fins 114a and 114b.

The epi-upper active fins 114a1 and 114b1 may be formed by removing the upper active fins 114a and 114b outside the two side surfaces of the gate structures 140a and 140b, and growing an epi-layer from the lower active fins 112a and 112b. The epi-upper active fins 114a1 and 114b1 formed on the two side surfaces of the gate structures 140a and 140b may include a compressively-stressed material or a material that is in a state of tension according to a required channel type of a transistor. For example, when a p-type transistor is formed, the epi-upper active fins 114a1 and 114b1 formed on the two side surfaces of the gate structures 140a and 140b may include a compressively stressed material. For example, when the lower active fins 112a and 112b are formed of silicon, the epi-upper active fins 114a1 and 114b1 may be formed of a material having a higher lattice constant than silicon (e.g., silicon germanium (SiGe)). When an n-type transistor is formed, the epi-upper active fins 114a1 and 114b1 formed on the two side surfaces of the gate structures 140a and 140b may include a material in a state of tension. For example, when the lower active fins 112a and 112b are formed of silicon, the epi-upper active fins 114a1 and 114b1 may be formed of a material having a lower lattice constant than silicon (e.g., silicon carbide (SiC)). In another embodiment, when the lower active fins 112a and 112b are formed of silicon, the epi-upper active fins 114a1 and 114b1 may be formed of silicon.

As shown in FIG. 12B, the epi-upper active fins 114a1 and 114b1 may be at a higher height than the upper active fins 114a and 114b. Thus, portions of lower portions of the two side surfaces of the gate structures 140a and 140b may be surrounded by the epi-upper active fins 114a1 and 114b1.

In addition, in the semiconductor device 100c according to the present embodiment, the epi-upper active fins 114a1 and 114b1 may have one of various shapes. For example, on a cross-sectional view perpendicular to a first direction (e.g., a "x" direction), the epi-upper active fins 114a1 and 114b1 may have one of various shapes, such as a diamond shape, a circular shape, an elliptical shape, or a polygonal shape. FIG. 11 illustrates an example in which each of the epi-upper active fins 114a1 and 114b1 has a pentagonal diamond shape.

The gate structures 140a and 140b may extend on the device isolation layers 120a and 120b1 and 120b2 across the active fins 110a2 and 110b2 along a second direction (e.g., along the "y" direction). Although FIG. 11 illustrates one gate structure 140a and 140b, a plurality of gate structures 140a and 140b may be disposed along the first direction (e.g., along the "x" direction). The gate structure 140a and 140b may include a first gate structure 140a disposed in the first region A and a second gate structure 140b disposed in the second region B. Although the first gate structure 140a and the second gate structure 140b both extend along the second direction, the first and second gate structures 140a and 140b may extend along different directions.

The first and second gate structures 140a and 140b may include gate insulating layers 142a and 142b, lower metal gate electrodes 144a and 144b, and upper metal gate electrodes 146a and 146b, respectively. The first gate structure 140a may be configured to surround the first active fin 110a2, and the second gate structure 140b may be configured to surround the second active fin 110b2. More specifically, the first gate structure 140a may surround portions of top and side surfaces of the upper active fin 114a of the first active fin 110a2, and the second gate structure 140b may surround portions of top and side surfaces of the upper active fin 114b of the second active fin 110b2.

The gate insulating layers 142a and 142b may be disposed between the lower metal gate electrodes 144a and 144b and the active fins 110a2 and 110b2, respectively. The gate insulating layers 142a and 142b may be formed of at least one material selected from the group consisting of a silicon oxide layer, a silicon nitride layer, a silicon oxynitride layer, an oxide/nitride/oxide (ONO) layer, or a high-k dielectric film having a higher dielectric constant than the silicon oxide layer. For example, the gate insulating layers 142a and 142b may have a dielectric constant of about 10 to about 25.

In a specific example, the gate insulating layers 142a and 142b may be formed a metal oxide, such as hafnium oxide ($HfO_2$), zirconium oxide ($ZrO_2$), titanium oxide ($TiO_2$), and aluminum oxide ($Al_2O_3$), silicates thereof, or aluminates thereof. Also, the gate insulating layers 142a and 142b may be formed of a metal oxynitride, such as aluminum oxynitride (AlON), zirconium oxynitride (ZrON), hafnium oxynitride (HfON), lanthanum oxynitride (LaON), and yttrium oxynitride (YON), silicates thereof, or aluminates thereof. Furthermore, the gate insulating layers 142a and 142b may be formed of a perovskite-type oxide, a niobate or tantalite system material, a tungsten-bronze system material, or a bismuth (Bi)-layered perovskite system material.

The gate insulating layers 142a and 142b may be formed by using various deposition methods, such as a chemical vapor deposition (CVD) process, a low-pressure CVD (LP-CVD) process, an atmospheric-pressure CVD (APCVD)

process, a low-temperature CVD (LTCVD) process, a plasma-enhanced CVD (PECVD) process, an atomic-layer CVD (ALCVD) process, an atomic layer deposition (ALD) process, or a physical vapor deposition (PVD). Meanwhile, as shown, the gate insulating layers 142a and 142b may be formed not only between the lower metal gate electrodes 144a and 144b and the active fins 110a2 and 110b2 but also between spacers 130a and 130b and the lower metal gate electrode 144a and 144b.

The lower metal gate electrodes 144a and 144b may be formed on the gate insulating layers 142a and 142b. The lower metal gate electrodes 144a and 144b may be formed of, for example, at least one selected from the group consisting of TiN, TaN, TaC, TaCN, TiAl, and TiAlC. The lower metal gate electrodes 144a and 144b may serve as work function control layers and/or barrier metal layers. Thus, the lower metal gate electrodes 144a and 144b may include the barrier metal layers or be formed in addition to the barrier metal layers. Alternatively, the lower metal gate electrodes 144a and 144b may serve as wetting layers configured to facilitate deposition of another conductive layer on a metal layer.

The upper metal gate electrodes 146a and 146b may be formed by using one metal layer or at least two metal layers. For example, each of the upper metal gate electrodes 146a and 146b may include a barrier metal layer and an electrode metal layer. Here, the barrier metal layer may be a single layer or a multilayered structure including at least one material selected from the group consisting of tungsten (W), tungsten nitride (WN), tungsten carbide (WC), titanium (Ti), titanium nitride (TiN), tantalum (Ta), tantalum nitride (TaN), ruthenium (Ru), cobalt (Co), manganese (Mn), nickel (Ni), or nickel boron (NiB). The electrode metal layer may include at least one selected from the group consisting of Al, Cu, or W. For example, the electrode metal layer may be formed of copper (Cu), copper tin (CuSn), copper magnesium (CuMg), cooper nickel (CuNi), copper zinc (CuZn), copper palladium (CuPd), copper gold (CuAu), copper rhenium (CuRe), copper tungsten (CuW), tungsten (W), or a W alloy, but the inventive concept is not limited thereto. Also, the electrode metal layer may be a single layer or a multilayered structure including at least one selected from the group consisting of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr). The barrier metal layer and the electrode metal layer may be formed by using a PVD or CVD process, but the inventive concept is not limited thereto.

Meanwhile, the gate structure 140a and 140b may include a work function control layer interposed between the gate insulating layers 142a and 142b and the lower metal gate electrodes 144a and 144b and/or between the lower metal gate electrodes 144a and 144b and the upper metal gate electrodes 146a and 146b. The work function control layer may be formed of, for example, at least one of titanium nitride (TiN), tantalum carbide (TaC), tantalum nitride (TaN), and tantalum carbon nitride (TaCN). More specifically, the gate structures 140a and 140b may include a p-type metal gate electrode or an n-type metal gate electrode according to a channel type of a transistor to be formed. For example, when a first active region and a second active region are defined on the semiconductor substrate 101, PMOS transistors are formed in the first active region, and NMOS transistors are formed in the second active region, gate structures 140a and 140b constituting the PMOS transistors may include p-type metal gate electrodes, while gate structures 140a and 140b constituting the NMOS transistors may include n-type metal gate electrodes. The work function control layer may be formed only under the p-type metal gate electrode but not formed under the n-type metal gate electrode.

The spacers 130a and 130b may be formed on two side surfaces of the gate structures 140a and 140b. Specifically, the spacers 130a and 130b may be formed on two side surfaces of the gate insulating layers 142a and 142b of the gate structures 140a and 140b. The spacers 130a and 130b may extend along a second direction (e.g., along the "y" direction) to surround the two side surfaces of the gate structures 140a and 140b. Also, similar to the gate structures 140a and 140b, the spacers 130a and 130b may run across the active fins 110a2 and 110b2 and surround portions of top and side surfaces of the active fins 110a2 and 110b2.

As shown in FIG. 12B, the spacers 130a and 130b may be disposed between epi-upper active fins 114a1 and 114b1 and the gate structures 140a and 140b, and the epi-upper active fins 114a1 and 114b1 may surround lower portions of the spacers 130a and 130b. The spacers 130a and 130b may include, for example, at least one of a silicon oxide layer, a silicon nitride layer, a silicon oxynitride layer, or a combination thereof.

In the semiconductor device 100c according to the present embodiment, the first active fin 110a2 formed in the first region A may have a symmetrical structure, and the second active fin 110b2 formed in the second region B may have an asymmetrical structure. More specifically, a portion of the first active fin 110a2 surrounded by the first gate structure 140a may have a symmetrical structure, while a portion of the second active fin 110b2 surrounded by the second gate structure 140b may have an asymmetrical structure. As described above, the lower active fins 112a and 112b and the upper active fins 114a and 114b may be disposed under the gate structures 140a and 140b, and have the same structures as the lower active fins 112a and 112b and the upper active fins 114a and 114b of the semiconductor device 100 described with reference to FIGS. 1 and 2.

In the semiconductor device 100c according to the present embodiment, the first active fins 110a2 of the first region A and the second active fins 110b2 of the second region B may be formed in different numbers to have different structures, thereby contributing toward improving reliability and operating performance of the entire semiconductor device.

Meanwhile, the semiconductor device 100c according to the present embodiment is not limited to the above-described structures of the gate structures 140a and 140b. For example, gate structures having various other structures than the above-described gate structures 140a and 140b may be applied to the semiconductor device 100c according to the present embodiment. Also, the gate structures having various other structures than the above-described gate structures 140a and 140b may be applied to the semiconductor device 100 shown in FIGS. 1 and 2, the semiconductor device 100a shown in FIG. 8, and the semiconductor device 100b shown in FIG. 10. Furthermore, the structures of the first active fins 110a2 and 110b2 including the epi-upper active fins 114a1 and 114b1 may be applied not only to the semiconductor device shown in FIGS. 1 and 2 but also to the semiconductor device 100a shown in FIG. 8 and the semiconductor device 100b shown in FIG. 10.

Figure 13A:
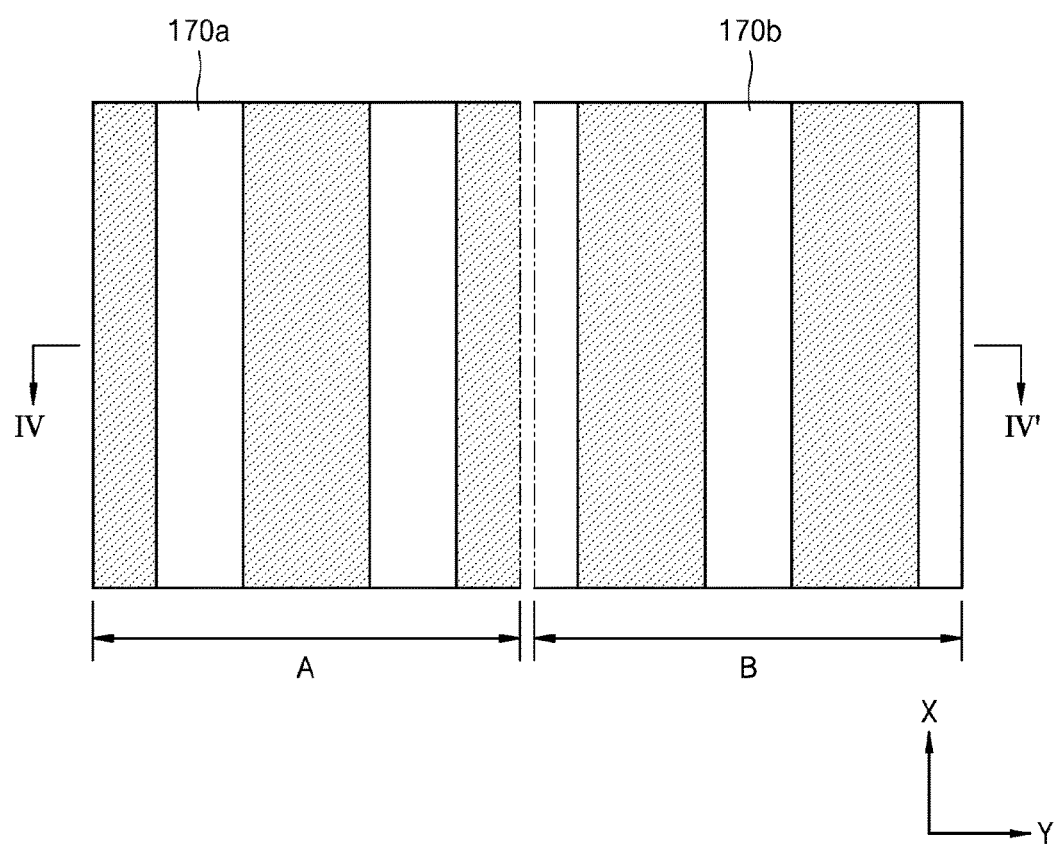
FIGS. 13A to 20B are plan views and cross-sectional views of a process of manufacturing the semiconductor device shown in FIG. 1, according to an exemplary embodiment, wherein FIGS. 13A, 14A, . . . , and 20A are plan views of the semiconductor device shown in FIG. 1, and FIGS. 13B, 14B, . . . , and FIG. 20B are cross-sectional views corresponding to the cross-sectional view of the semiconductor device shown in FIG. 2, which are cross-sectional views taken along portions IV-IV' shown in FIGS. 13A, 14A, . . . , and 20A, respectively.
Figure 13B:
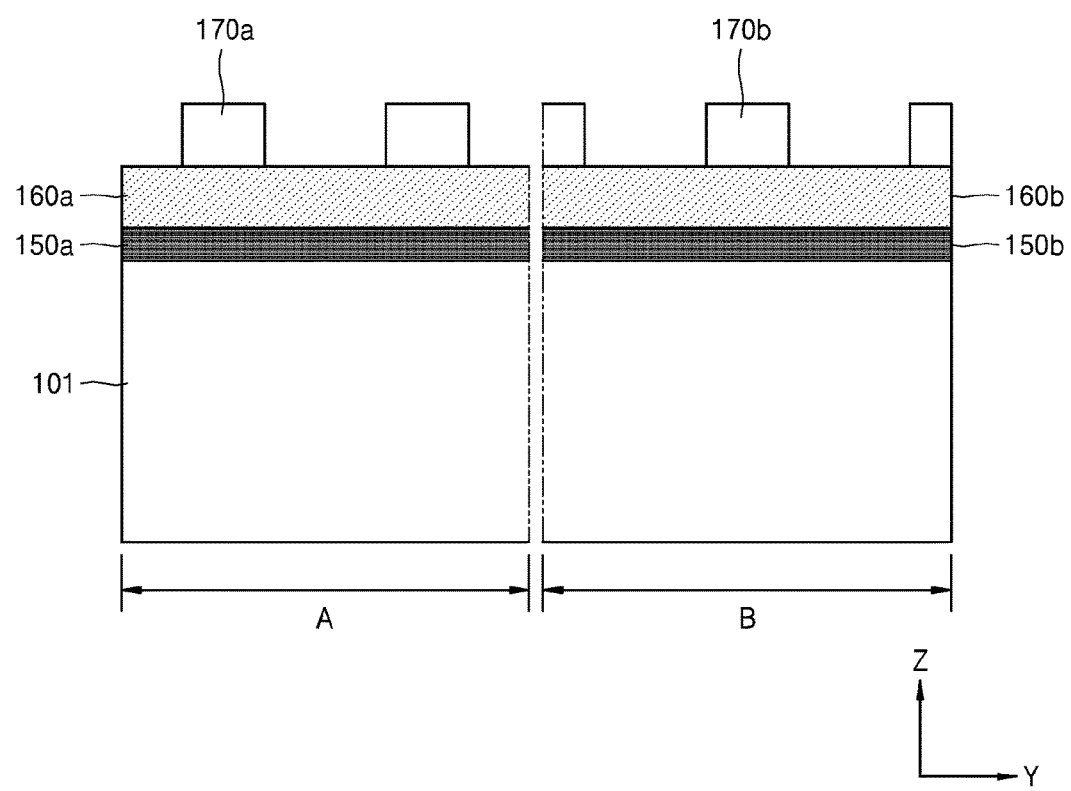
Figure 14A:
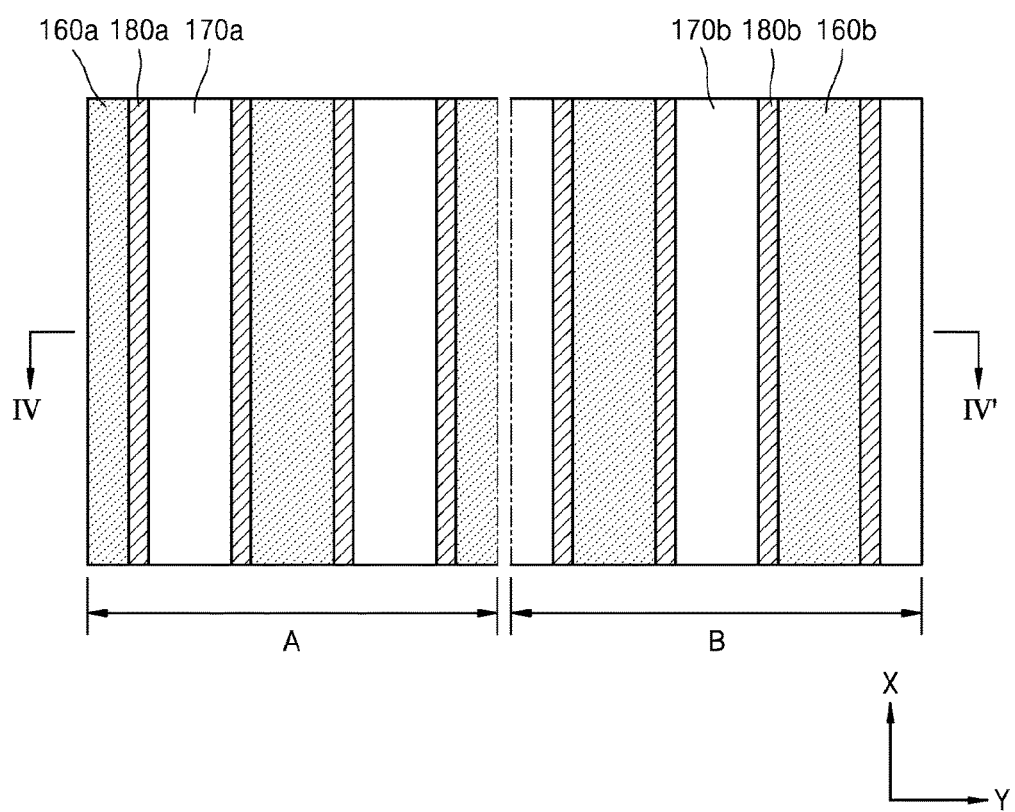
Figure 14B:
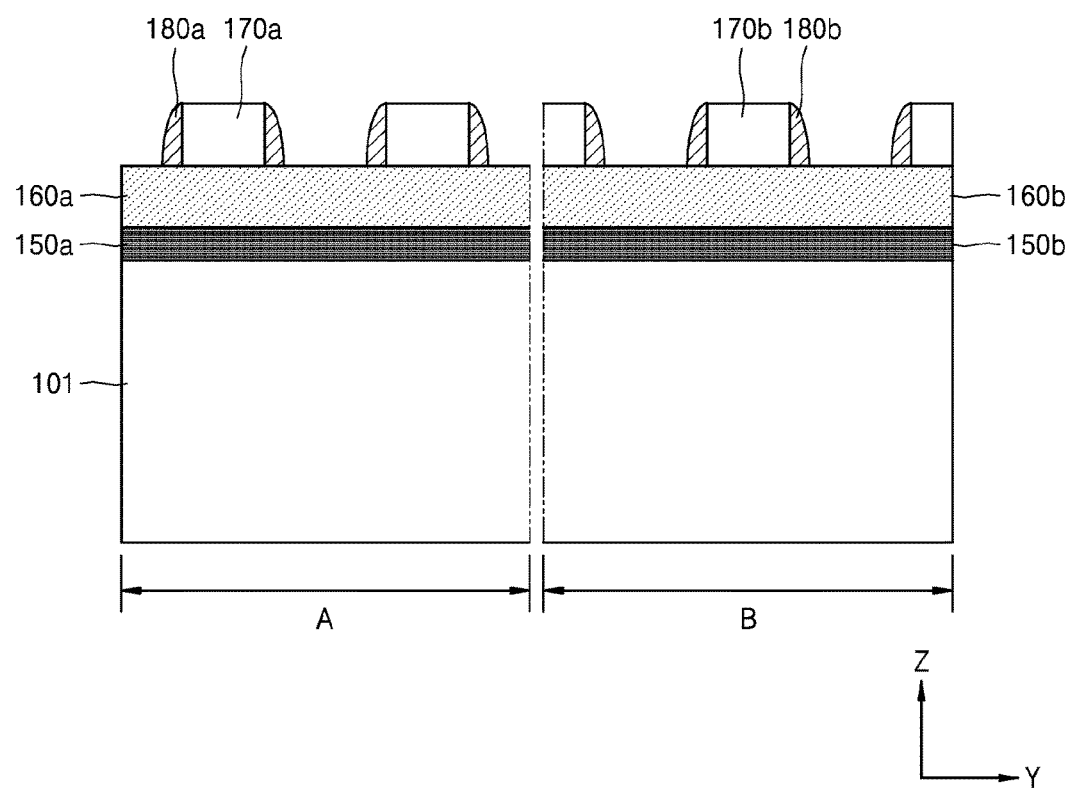
Figure 19A:
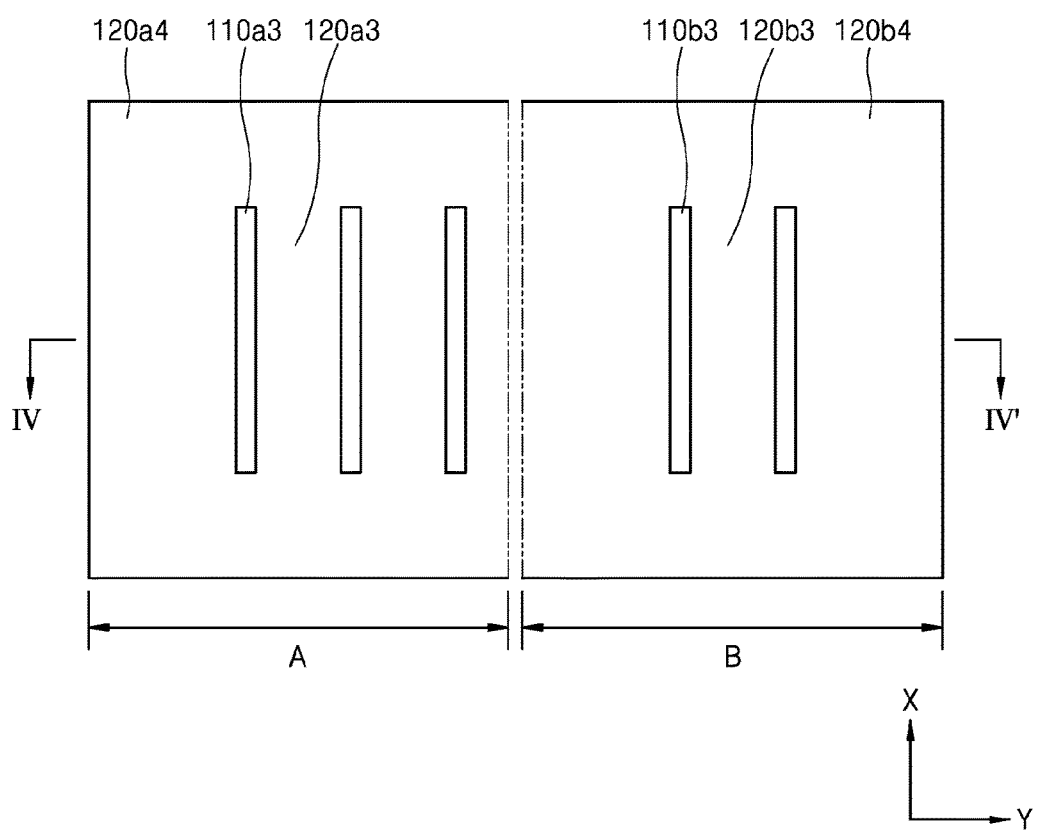
Figure 19B:
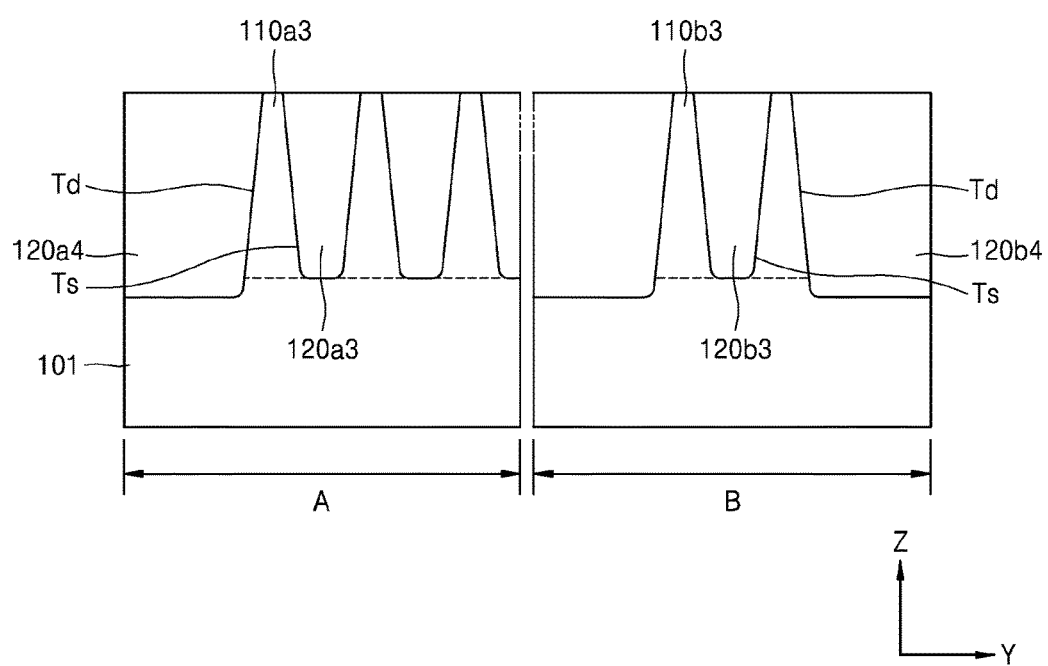
Figure 20A:
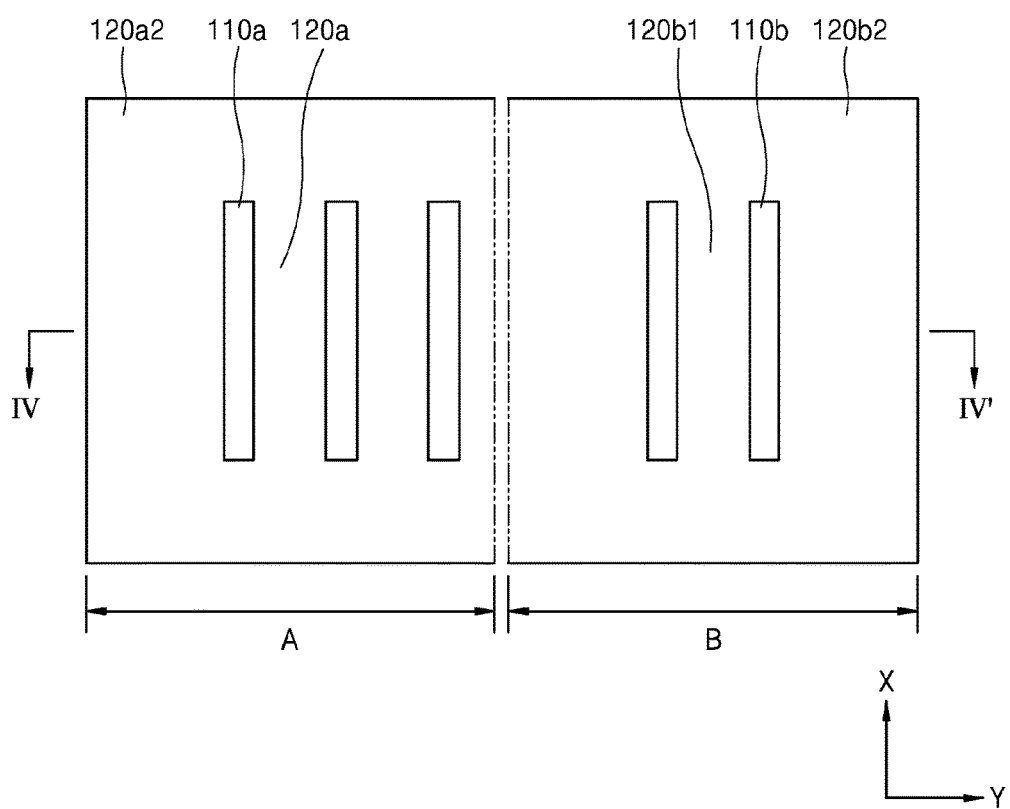
Figure 20B:
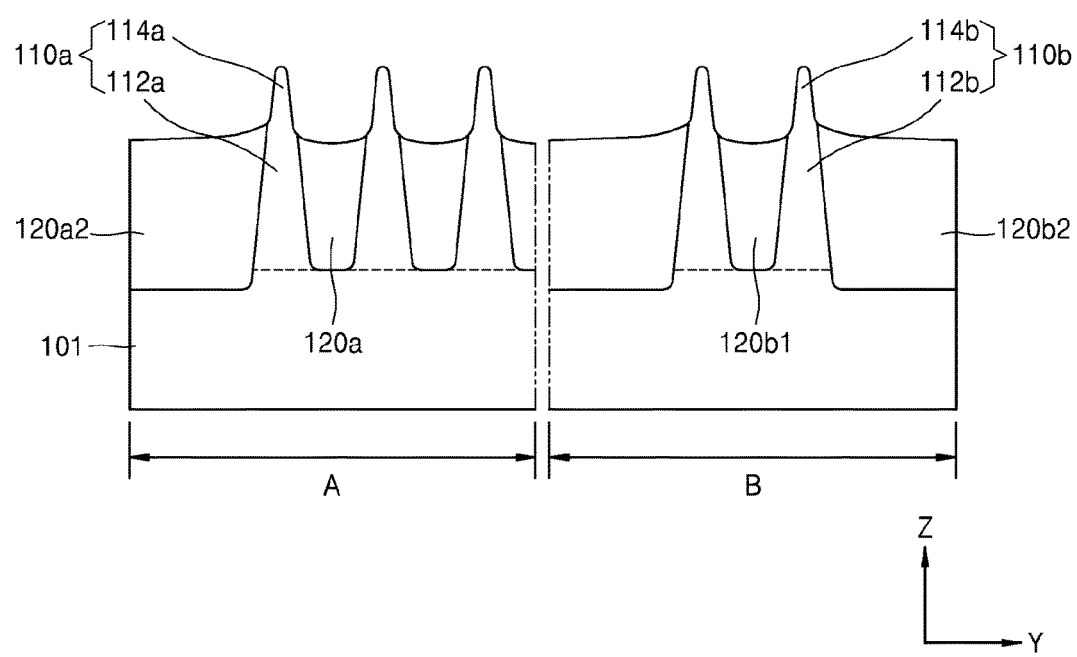

FIGS. 13A to 20B are plan views and cross-sectional views of a process of manufacturing the semiconductor device shown in FIG. 1, according to an exemplary embodiment, wherein FIGS. 13A, 14A, . . . , and 20A are plan views of the semiconductor device shown in FIG. 1, FIGS. 13B, 14B, . . . , and FIG. 20B are cross-sectional views corresponding to the cross-sectional view of the semiconductor device 100 shown in FIG. 2, which are cross-sectional views taken along portions IV-IV shown in FIGS. 13A, 14A, . . . , and 20A, respectively.

Referring to FIGS. 13A and 13B, a semiconductor substrate 101 in which a first region A and a second region B are defined may be prepared. The semiconductor substrate 101 may be, for example, a silicon bulk substrate or an SOI substrate. Specific descriptions of the semiconductor substrate 101 are the same as those of the semiconductor device 100 shown in FIGS. 1, and 2.

A hard mask structure may be formed on the semiconductor substrate 101. The hard mask structure may include a structure in which a plurality of hard masks are stacked to form an active fin. In the present embodiment, the hard mask structure may have a double structure including different thin layers. For example, the hard mask structure may include silicon nitride layers 150*a* and 150*b* and poly-Si layers 160*a* and 160*b*. A silicon oxide layer may be formed instead of the poly-Si layers 160*a* and 160*b*. The hard mask structure is not limited to the double structure. For example, the hard mask structure may include at least four different thin layers, such as a pad oxide layer, a silicon nitride layer, a silicon oxide layer, and a poly-Si layer.

Dummy mask patterns 170*a* and 170*b* may be formed on the poly-Si layer 160*a* and 160*b*. The dummy mask patterns 170*a* and 170*b* may have line shapes extending along a first direction (e.g., along a "x" direction). During a subsequent process, mask patterns having spacer shapes may be formed on two side surfaces of the dummy mask patterns 170*a* and 170*b*. Thus, in consideration of positions in which the mask patterns should be formed, the dummy mask patterns 170*a* and 170*b* may be formed in appropriate positions to have a width in the second direction (y direction). For example, the width of the dummy mask patterns 170*a* and 170*b* in the second direction may correspond to a distance between the mask patterns, and a distance between the dummy mask patterns 170*a* and 170*b* may correspond to the sum of the widths of the two mask patterns and the distance between the mask patterns.

The dummy mask patterns 170*a* and 170*b* may be formed of a material having an etch selectivity with respect to the poly-Si layers 160*a* and 160*b*. That is, the poly-Si layers 160*a* and 160*b* may be hardly etched during a process of etching the dummy mask patterns 170*a* and 170*b*. For example, the dummy mask patterns 170*a* and 170*b* may be formed of a material, such as silicon nitride or silicon oxide. In another example, the dummy mask patterns 170*a* and 170*b* may be formed by using a carbon (C)-rich amorphous carbon layer (ACL) or spin on hardmask (SOH).

Referring to FIGS. 14A and 14B, a spacer thin layer may be formed on surfaces of the dummy mask patterns 170*a* and 170*b* and a top surface of the hard mask structure. The spacer thin layer may be formed of a material having an etch selectivity with each of the dummy mask patterns 170*a* and 170*b* and the poly-Si layers 160*a* and 160*b*. That is, during a process of etching the spacer thin layer, the poly-Si layers 160*a* and 160*b* and the dummy mask patterns 170*a* and 170*b* may be hardly etched. Also, the spacer thin layer may be formed of a material that is hardly etched during a process of etching the dummy mask patterns 170*a* and 170*b*. For example, when the dummy mask patterns 170*a* and 170*b* are formed of silicon nitride or SOH, the spacer thin layer may be formed of silicon oxide.

The spacer thin layer may be etched, thereby forming first mask patterns 180*a* and 18*b* having spacer shapes on two sidewalls of the dummy mask patterns 170*a* and 170*b*. In a subsequent process, the first mask patterns 180*a* and 180*b* may serve as etch mask patterns for forming the active fins. Accordingly, the first mask patterns 180*a* and 180*b* may be disposed to correspond to regions in which the active fins will be formed. Also, the first mask patterns 180*a* and 180*a* may have widths corresponding to a width of the first active fin of the first region A and a width of the second active fin of the second region B in the second direction (y direction).

Figure 15B:
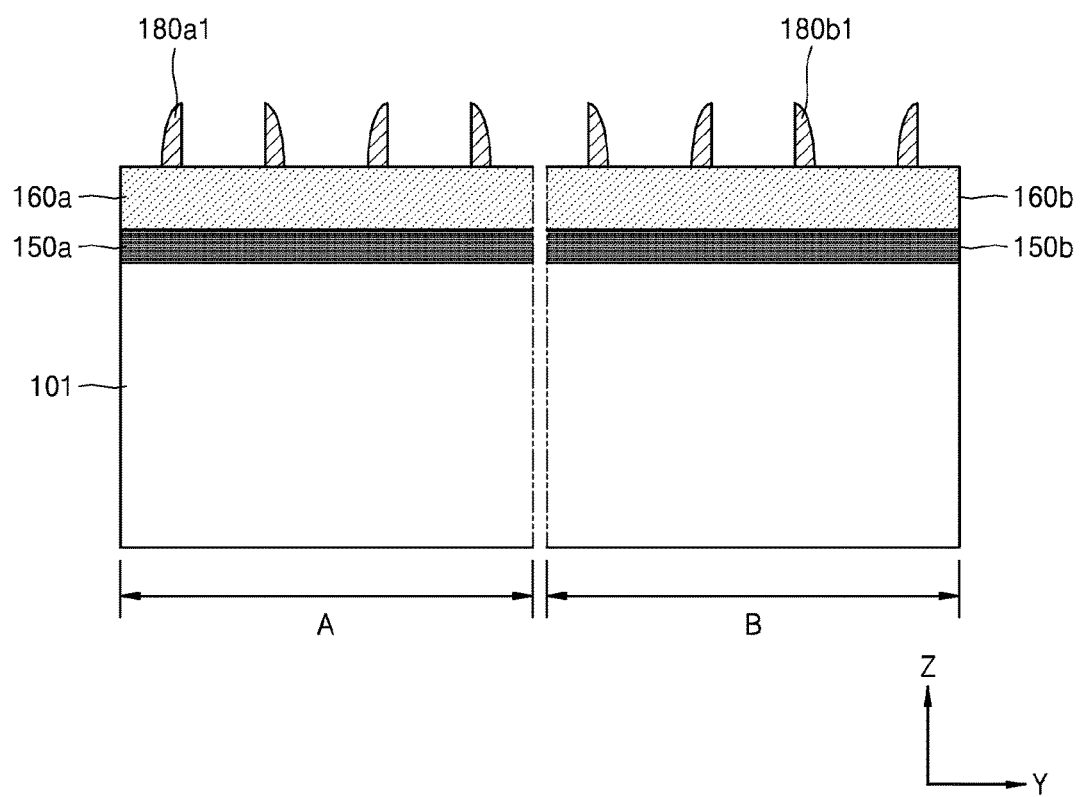

Referring to FIGS. 15A and 15B, the dummy mask patterns 170*a* and 170*b* may be removed. Accordingly, only first mask patterns 180*a*1 and 180*b*1 having spacer shapes may be left on the hard mask structure. Meanwhile, before or after the dummy mask patterns 170*a* and 170*b* are removed, a cutting process of cutting each of the first mask patterns 180*a* and 180*b* into several portions may be performed. Since the process of cutting the first mask patterns 180*a* and 180*b* ends in cutting active fins formed under the first mask patterns 180*a* and 180*b*, the process may be called a fin cutting process. Meanwhile, the fin cutting process may be performed not in the current process operation but after the active fins are formed.

Figure 16A:
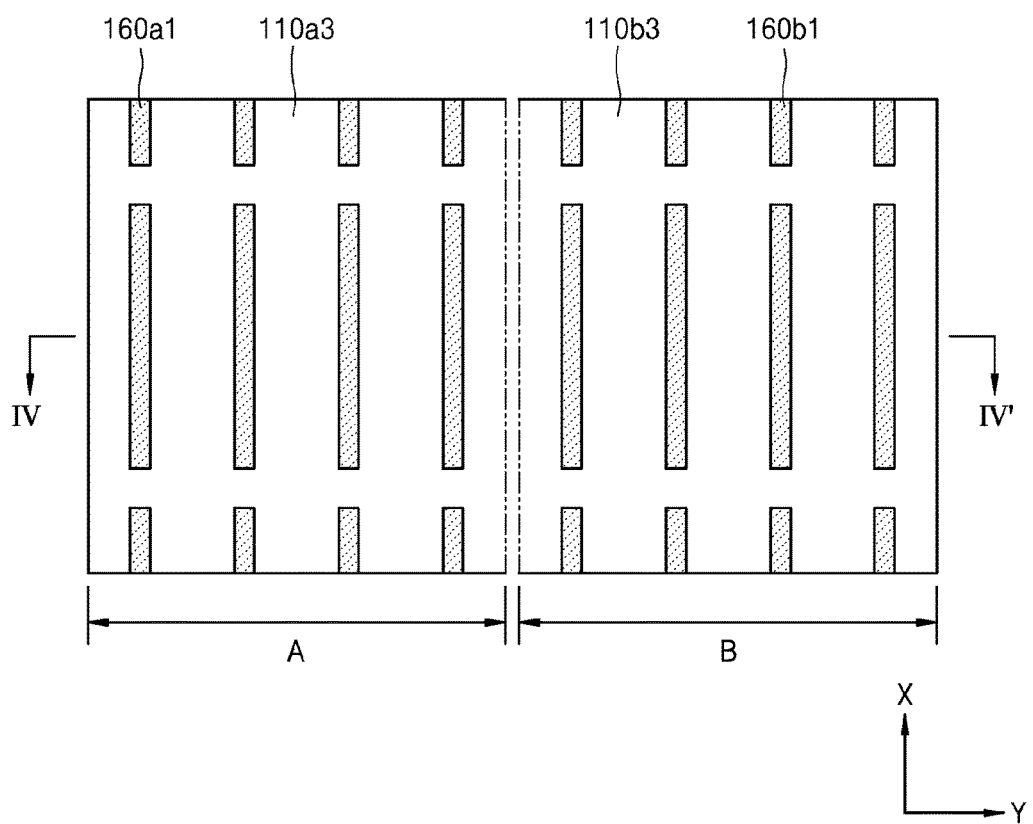
Figure 16B:
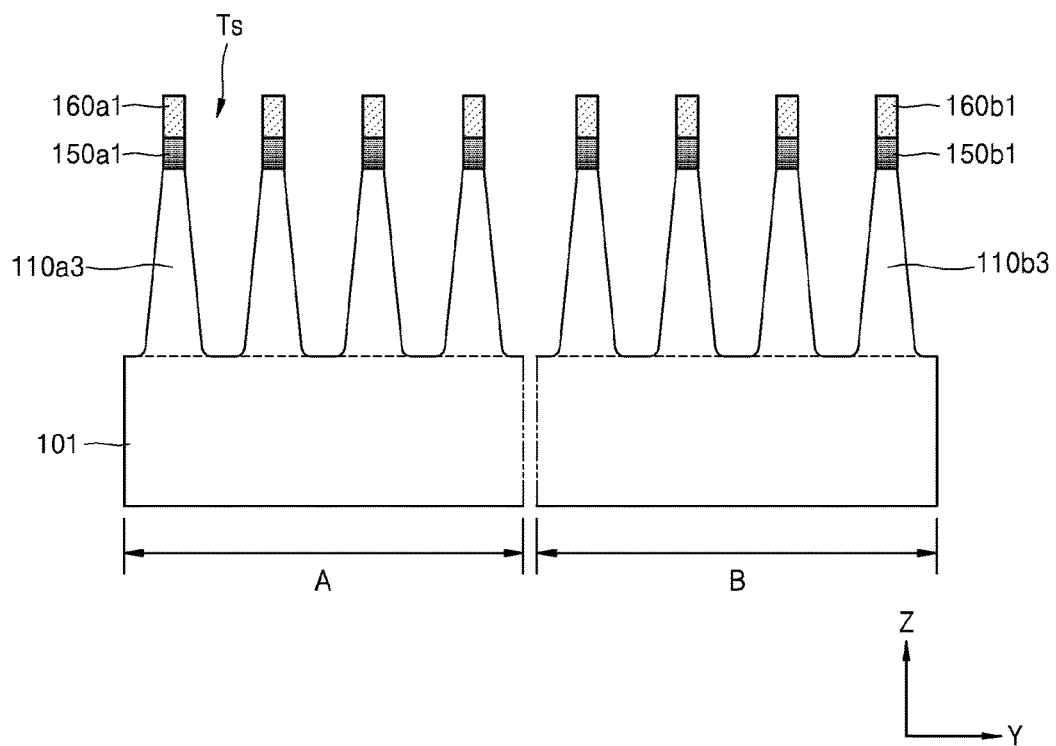

Referring to FIGS. 16A and 16B, the hard mask structure may be sequentially etched by using the first mask patterns 180*a*1 and 180*b*1 as an etch mask. Due to the etching process, a hard mask pattern may be formed. The hard mask pattern may include silicon nitride layer patterns 150*a*1 and 150*b*1 and poly-Si layer patterns 160*a*1 and 160*b*1. Subsequently, the semiconductor substrate 101 may be etched by using the hard mask pattern as an etch mask, thereby forming first trenches Ts extending along a first direction (e.g., along a "x" direction). As a result, active fins 110*a*3 and 110*b*3 may be formed to extend along the first direction (e.g., along the "x" direction). Specifically, first active fins 110*a*3 may be formed in the first region A, and second active fins 110*b*3 may be formed in the second region B.

A thickness of the hard mask pattern may be reduced during the process of forming the active fins 110*a*3 and 110*b*3. For example, thicknesses of the poly-Si layer patterns 160*a*1 and 160*b*1 may be reduced.

Figure 17A:
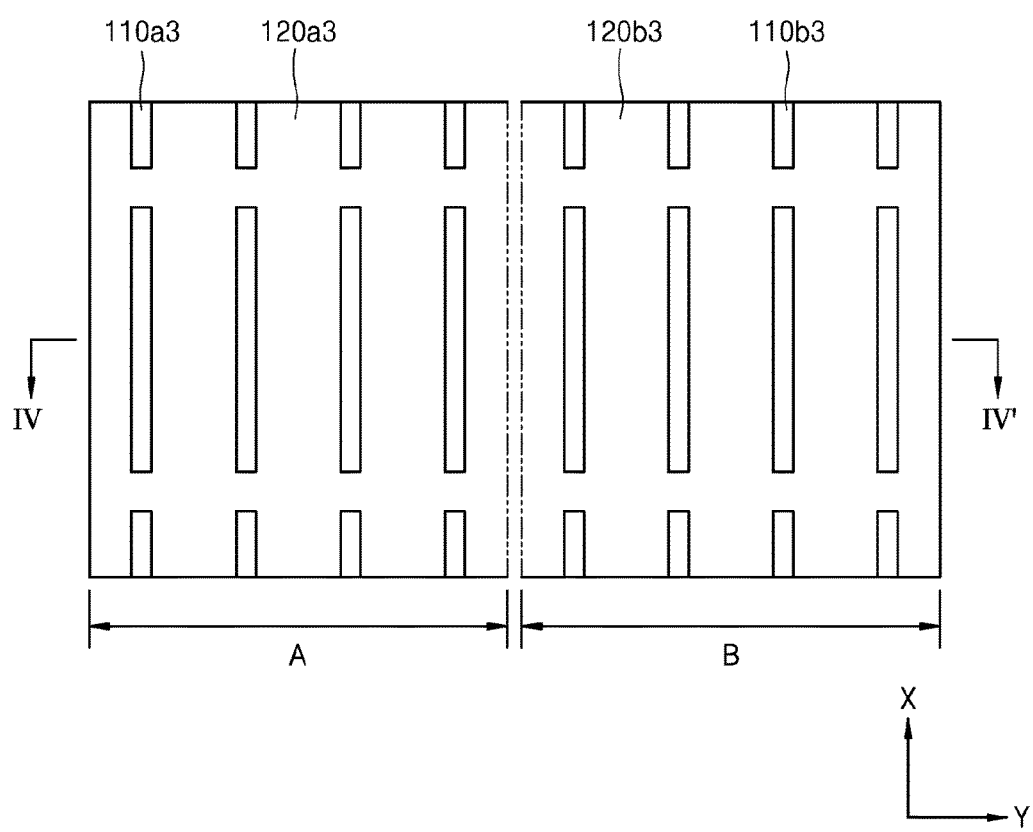
Figure 17B:
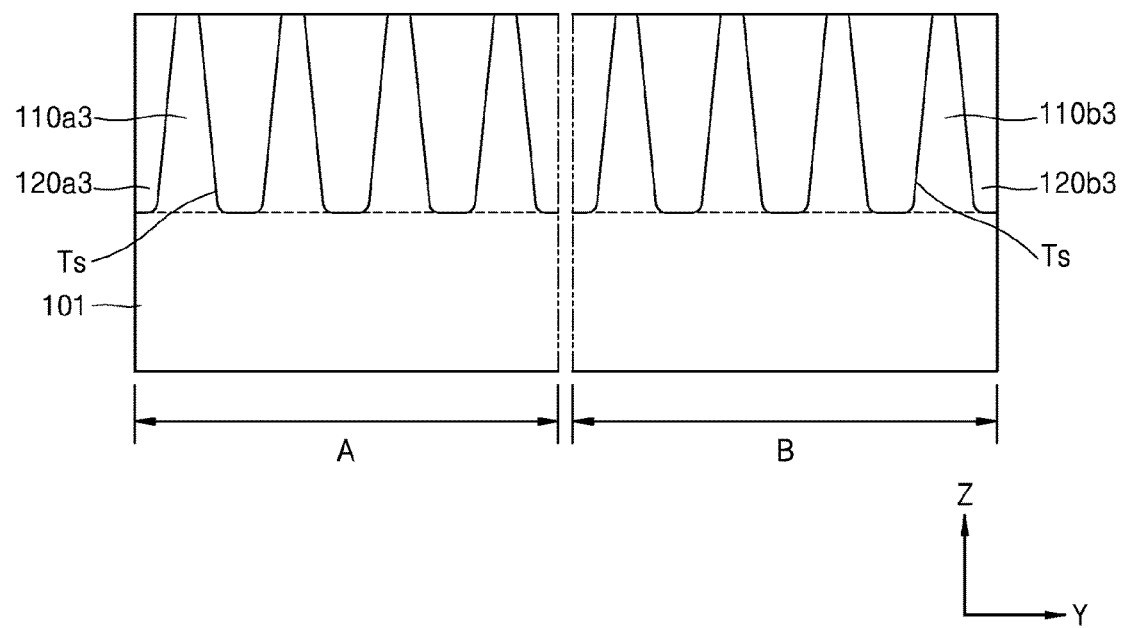

Referring to FIGS. 17A and 17B, an insulating layer may be formed to fill the first trenches Ts and cover the active fins 110*a*3 and 110*b*3. For example, the insulating layer may include a silicon oxide layer, but a material of the insulating layer is not limited thereto. The process of filling the first trenches Ts may be performed by using a flowable chemical vapor deposition (FCVD) process. The FCVD process may be a process of filling gaps, such as trenches, by using a flowable deposition material. Gaps having a width of about 20 nm or less may be filled with the insulating material by using surface tension between materials.

After the insulating layer is formed to fill the first trenches Ts and cover the active fins 110*a*3 and 110*b*3, the insulating layer may be planarized to form first insulating layers 120*a*3 and 120*b*3 between the active fins 110*a*3 and 110*b*3. The planarization process may be performed by using, for example, a chemical mechanical polishing (CMP) process. Due to the planarization process, top surfaces of the active fins 110*a*3 and 110*b*3 may be exposed from top surfaces of the first insulating layers 120*a*3 and 120*b*3. That is, side surfaces of the active fins 110*a*3 and 110*b*3 may be surrounded by the first insulating layers 120*a*3 and 120*b*3.

Figure 18A:
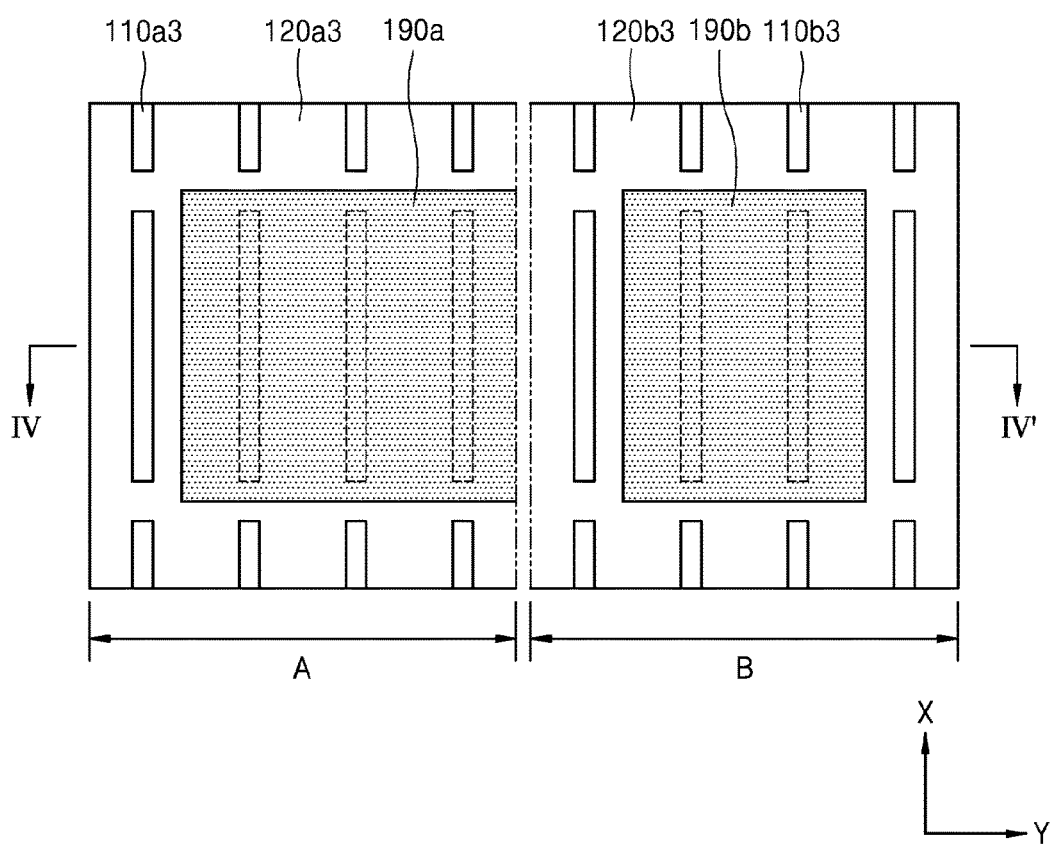
Figure 18B:
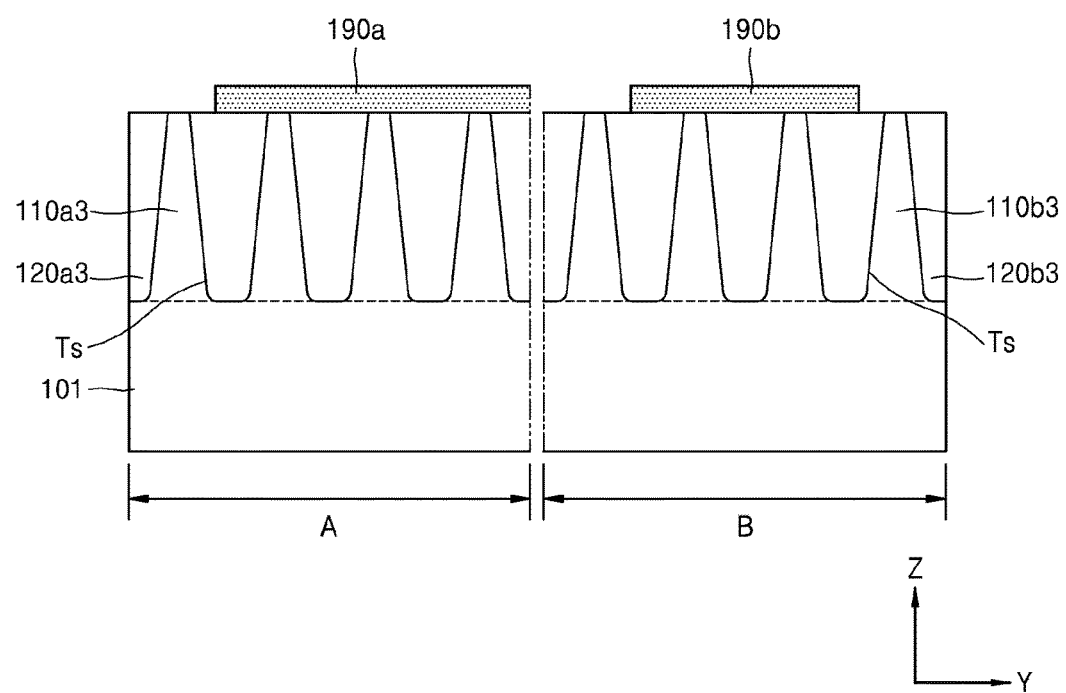

Referring to FIGS. 18A and 18B, after the planarization process, photomask patterns 190*a* and 190*b* covering predetermined regions may be formed on the resultant structure of the semiconductor substrate 101. The photomask patterns 190a and 190b may be formed to limit the number of active fins included in the predetermined regions. For example, a first photomask pattern 190a may be formed to cover at least three active fins 110a3 in a predetermined region of the first region A, while a second photomask pattern 190b may be formed to cover two active fins 110b3 in a predetermined region of the second region B.

Since the numbers of the active fins 110a3 and 110b3 are limited by the photomask patterns 190a and 190b, it may be determined whether each of the active fins has a symmetrical structure due to shapes of the photomask patterns 190a and 190b during a subsequent process. In other words, when each of the photomask patterns 190a and 190b is formed to cover one active fin or at least three active fins, each of the covered active fins may be subsequently determined as a symmetrical active fin; whereas when each of the photomask patterns 190a and 190b is formed to cover two active fins, each of the covered active fins may be subsequently determined as an asymmetrical active fin.

Referring to FIGS. 19A and 19B, the semiconductor substrate 101, the active fins 110a3 and 110b3, and the first insulating layers 120a3 and 120b3 disposed under the photomask patterns 190a and 190b may be etched by using the photomask patterns 190a and 190b as an etch mask thereby forming second trenches Td. Each of the second trenches Td may correspond to the outer second trench Tr2e of the semiconductor device 100 shown in FIGS. 1 and 2. Meanwhile, each of the first trenches Ts may correspond to the first trench Tr1 or the central second trench Tr2c of the semiconductor device 100 shown in FIGS. 1 and 2. Thus, a depth of the second trenches Td and a width of the second trenches Td along a second direction (e.g., along a "y" direction) may be respectively greater than the depth of the first trenches Ts and the width of the first trenches Ts in the second direction (y direction). In some cases, the depth of the second trenches Td and the width of the second trenches Td in the second direction (y direction) may be respectively less than the depth of the first trenches Ts and the width of the first trenches Ts second direction (y direction).

After the second trenches Td are formed, an insulating layer may be formed to fill the second trenches Td and cover the active fins 110a3 and 110b3 and the first insulating layer 120a3 and 120b3. For example, the insulating layer may include the same silicon oxide layer as the first insulating layers 120a3 and 120b3, but a material of the insulating layer is not limited thereto. Also, a process of filling the second trenches Td with the insulating layer may be performed by using an FCVD process. However, since the second trenches Td have a relatively large width, the second trenches Td may be filled with the insulating layer by using a typical deposition process instead of the FCVD process.

After the insulating layer is formed to cover the second trenches Td and cover the active fins 110a3 and 110b3 and the first insulating layer 120a3 and 120b3, the insulating layer may be planarized to form second insulating layers 120a4 and 120b4. The planarization process may be performed by, for example, a CMP process. For example, the second insulating layers 120a4 and 120b4 may correspond to the outer second device isolation layer 120b2 of the semiconductor device 100 shown in FIGS. 1 and 2.

Referring to FIGS. 20A and 20B, a recess process may be performed on the first insulating layers 120a3 and 120b3 and the second insulating layers 120a4 and 120b4 by using a method of removing partial upper portions of the first insulating layers 120a3 and 120b3 and the second insulating layers 120a4 and 120b4.

In some embodiments, the recessing of the first insulating layers 120a3 and 120b3 and the second insulating layers 120a4 and 120b4 may be performed by using a dry etching process, a wet etching process, or a combination thereof. For example, the partial upper portions of the first insulating layers 120a3 and 120b3 and the second insulating layers 120a4 and 120b4 may be removed by using a dry etching process, for example, a reactive ion etching (RIE) process.

During the recessing of the first insulating layers 120a3 and 120b3 and the second insulating layers 120a4 and 120b4, the active fins 110a3 and 110b3 exposed in the first region A and the second region B may be partially consumed. Specifically, since upper portions of the active fins 110a3 and 110b3 are exposed to an etching atmosphere and/or a cleaning atmosphere, the upper portions of the active fins 110a3 and 110b3 may be partially consumed due to an etching process, an oxidation process and/or a cleaning process.

Thus, the upper portions of the active fins 110a3 and 110b3 may protrude from the device isolation layers 120a, 120a2, 120b1, and 120b2 and be partially consumed due to the recess process. As a result, active fins 110a and 110b having symmetrical and/or asymmetrical structures, which are similar to the upper active fins 114a and 114b of the semiconductor device 100 shown in FIGS. 1 and 2, may be formed.

Specifically, since a width of the first insulating layers 120a3 and 120b3 in the second direction (y direction) is small and a distance between the active fins 110a3 and 110b3 is small, a large amount of etchant may reach central portions of the first insulating layers 120a3 and 120b3 so that the central portions thereof may be etched to a large extent during the recess process for making the active fins 110a3 and 110b3 protrude. When edge portions of the first insulating layers 120a3 and 120b3 has a sufficient depth, an etchant may reach the side surfaces of the active fins 110a3 and 110b3 earlier than the top surfaces of the first insulating layers 120a3 and 120b3 and etch the side surfaces of the active fins 110a3 and 110b3 so that the side surfaces of the active fins 110a3 and 110b3 may have almost vertical profiles. For this reason, the side surfaces of the active fins 110a3 and 110b3, which contact the first insulating layers 120a3 and 120b3, may protrude at relatively low points from the first insulating layers 120a3 and 120b3. Also, connection portions CA of the side surfaces of the active fins 110a3 and 110b3, which contact the first insulating layers 120a3 and 120b3, may have increased mean inclinations and reduced mean curvatures.

In contrast, since the second insulating layers 120a4 and 120b4 have large widths in the second direction (y direction), the entire top surfaces of the second insulating layers 120a4 and 120b4 may be uniformly etched during a recess process for making the active fins 110a3 and 110b3 protrude so that the second insulating layers 120a4 and 120b4 may have somewhat flat top surfaces. Thus, the side surfaces of the active fins 110a3 and 110b3, which contact edge portions of the top surface of the second insulating layers 120a4 and 120b4, may be connected at a relatively large curvature. Accordingly, the side surfaces of the active fins 110a3 and 110b3, which contact the second insulating layers 120a4 and 120b4, may protrude at high points from the second insulating layers 120a4 and 120b4. Also, the connection portions CA of the side surfaces of the active fins 110a3 and 110b3, which contact the second insulating layers 120a4 and 120b4, may have reduced mean inclinations and increased mean curvatures.

For reference, after the recess process, the first insulating layers 120*a*3 and 120*b*3 may be a first device isolation layer 120*a* and a central second device isolation layer 120*b*1, and the second insulating layers 120*a*4 and 120*b*4 may be an outer first device isolation layer 120*a*2 and an outer second device isolation layer 120*b*2.

After the upper active fins 114*a* and 114*b* protrude in the first region A and the second region B, a process of implanting impurity ions for controlling a threshold voltage may be performed on the upper active fins 114*a* and 114*b*. During the ion implantation process, boron (B) ions may be implanted as impurity ions into regions of the upper active fins 114*a* and 114*b* in which NMOS transistors will be formed, while phosphorus (P) or arsenic (As) ions may be implanted as impurity ions into regions of the upper active fins 114*a* and 114*b* in which PMOS transistors will be formed.

Figure 21:
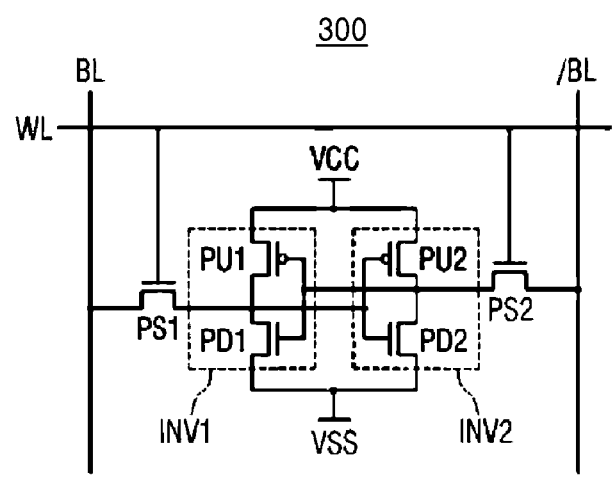
FIGS. 21 and 22 are a circuit diagram and a schematic layout, respectively, of a semiconductor device according to an exemplary embodiment.
Figure 22:
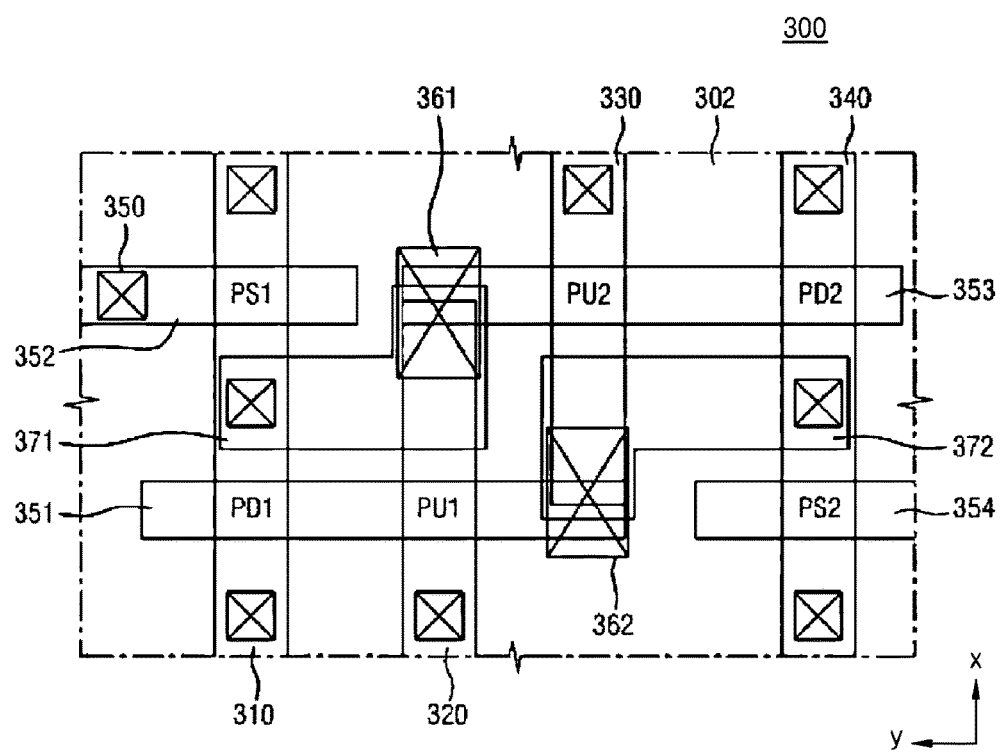

FIGS. 21 and 22 are a circuit diagram and a layout of a semiconductor device 300 according to an exemplary embodiment.

Referring to FIGS. 21 and 22, the semiconductor device 300 may include a pair of inverters INV1 and INV2, which are connected in parallel between a power supply node Vcc and a ground node Vss, and a first pass transistor PS1 and a second pass transistor PS2, which are connected to output nodes of the inverters INV1 and INV2, respectively. The first pass transistor PS1 and second pass transistor PS2 may be connected to a bit line BL and a complementary bit line /BL, respectively. Gates of the first pass transistor PS1 and the second pass transistor PS2 may be connected to a word line WL.

The first inverter INV1 may include a first pull-up transistor PU1 and a first pull-down transistor PD1 that are connected in series, while the second inverter INV2 may include a second pull-up transistor PU2 and a second pull-down transistor PD2 that are connected in series. The first pull-up transistor PU1 and the second pull-up transistor PU2 may be PMOS transistors, while the first pull-down transistor PD1 and the second pull-down transistor PD2 may be NMOS transistors.

In addition, an input node of the first inverter INV1 may be connected to an output node of the second inverter INV2, and an input node of the second inverter INV2 may be connected to an output node of the first inverter INV1 so that the first inverter INV1 and the second inverter INV2 constitute one latch circuit.

A first active region 310, a second active region 320, a third active region 330, and a fourth active region 340, which are spaced apart from one another, may extend along a first direction (e.g., along the "x" direction). The second active region 320 and the third active region 330 may have smaller extension lengths than the first active region 310 and the fourth active region 340.

In addition, a first gate electrode 351, a second gate electrode 352, a third gate electrode 353, and a fourth gate electrode 354 may extend along the second direction (e.g., along the "y" direction) and intersect the first active region 310 to the fourth active region 340. Specifically, the first gate electrode 351 may intersect the first active region 310 and the second active region 320 and partially overlap a lower end of the third active region 330. The third gate electrode 353 may intersect the third active region 330 and the fourth active region 340 and partially overlap an upper end of the second active region 320. The second gate electrode 352 and the fourth gate electrode 354 may be formed to intersect the first active region 310 and the fourth active region 340, respectively.

As shown in FIG. 22, a first pull-up transistor PU1 may be defined around an intersection region between the first gate electrode 351 and the second active region 320, a first pull-down transistor PD1 may be defined around an intersection region between the first gate electrode 351 and the first active region 310, and a first pass transistor PS1 may be defined around an intersection region between the second gate electrode 352 and the first active region 310. A second pull-up transistor PU2 may be defined around an intersection region between the third gate electrode 353 and the third active region 330, a second pull-down transistor PD2 may be defined around an intersection between the third gate electrode 353 and the fourth active region 340, and a second pass transistor PS2 may be defined around an intersection region between the fourth gate electrode 354 and the fourth active region 340.

Although not clearly shown, source and drain regions may be formed on two sides of each of intersection regions between the first to fourth gate electrodes 351 to 354 and the first to fourth active regions 310 and 340. Also, a plurality of contacts 350 may be formed. In addition, a shared contact 361 may simultaneously connect the second active region 320, the third gate electrode 353, and an interconnection 371. The shared contact 362 may simultaneously connect the third active region 330, the first gate electrode 351, and an interconnection 372.

For example, the semiconductor device 300 according to the present embodiment may correspond to an SRAM. Here, the first to fourth active regions 310 to 340 may correspond to active fins formed in the first region A or the second region B of each of the semiconductor devices 100, 100*a*, 100*b*, and 100*c* shown in FIGS. 1 to 12B. Also, the first to fourth gate electrodes 351 to 354 may correspond to gate structures formed in the first region A or the second region B of each of the semiconductor devices 100, 100*a*, 100*b*, and 100*c* shown in FIGS. 1 to 12B. Although not shown, when a transistor is disposed in a peripheral region of the SRAM to apply a power supply voltage or a ground voltage, an active region and a gate electrode of the transistor may respectively correspond to the active fin and the gate electrode formed in the first region A or the second region B of each of the semiconductor devices 100, 100*a*, 100*b*, and 100*c* shown in FIGS. 1 to 12B.

Figure 23:
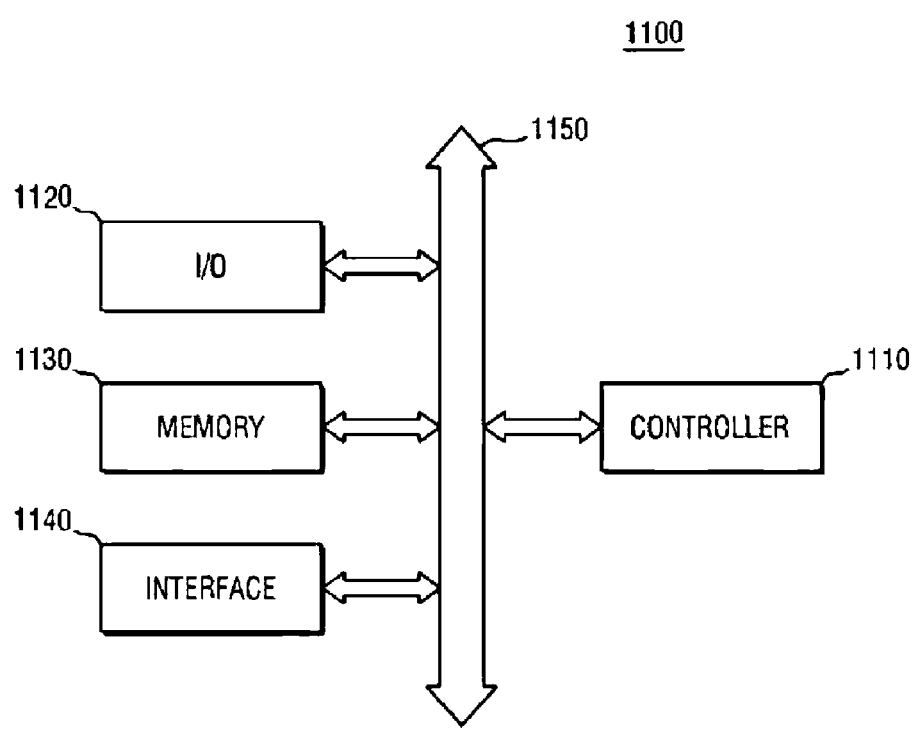
FIGS. 23 and 24 are block diagrams of electronic systems including semiconductor devices according to exemplary embodiments.
Figure 24:
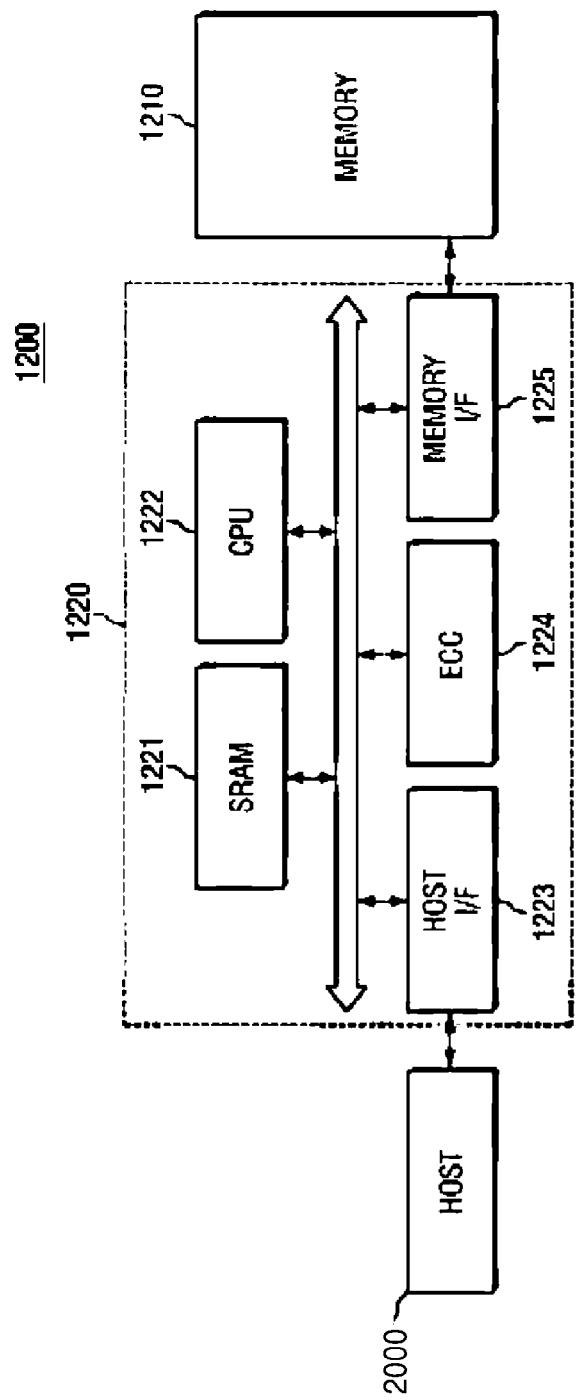

FIGS. 23 and 24 are block diagrams of electronic systems 1100 and 1200 including semiconductor devices according to exemplary embodiments.

Referring to FIG. 23, the electronic system 1100 according to the present embodiment may include a controller 1110, an input/output (I/O) device 1120, a memory 1130, an interface 1140, and a bus 1150. The controller 1110, the I/O device 1120, the memory 1130, and/or interface 1140 may be connected to one another through a bus 1150. The bus 1150 may correspond to a path through which data is transmitted.

The controller 1110 may include at least one of a microprocessor (MP), a digital signal processor (DSP), a microcontroller (MC), and logic devices capable of performing similar functions thereto. The I/O device 1120 may include a keypad, a keyboard, and a display device. The memory 1130 may store data and/or commands. The interface 1140 may transmit data to a communication network or receive data from the communication network. The interface 1140 may be a wired type or a wireless type. For instance, the interface 1140 may include an antenna or a wired/wireless transceiver.

Although not shown, the electronic system 1100 may further include a high-speed DRAM and/or SRAM as an operation memory configured to improve an operation of the controller 1110. At least one of the semiconductor devices 100, 100a, 100b, and 100c according to exemplary embodiments may be provided in the memory 1130 or provided as a portion of the controller 1110 or the I/O device 1120.

The electronic system 1100 may be applied to a personal digital assistant (PDA), a portable computer, a web tablet, a wireless phone, a mobile phone, a digital music player, a memory card, any other electronic product capable of transmitting and/or receiving information in wireless environments.

Referring to FIG. 24, the electronic system 1200 according to an exemplary embodiment may be a memory card. The electronic system 1200 may include a memory 1210 and a memory controller 1220. The memory controller 1220 may control exchange of data between a host 2000 and the memory 1210. The memory 1210 and the memory controller 1220 may include at least one of the semiconductor devices 100, 100a, 100b, and 100c according to exemplary embodiments.

The memory controller 1220 may include an SRAM 1221, a central processing unit (CPU) 1222, a host interface 1223, an error correction code (ECC) 1224, and a memory interface 1225. The SRAM 1221 may be used as an operation memory of the CPU 1222. The host interface 1223 may include a protocol by which the host 2000 may be connected to the electronic system 1200 and exchange data. The ECC 1224 may detect and correct errors in data read from the memory 1210. The memory interface 1225 may interface with the memory 1210 to input and output data to and from the memory 1210. The CPU 1222 may perform the overall control operation related to a data exchange operation of the memory controller 1220.

Figure 25:
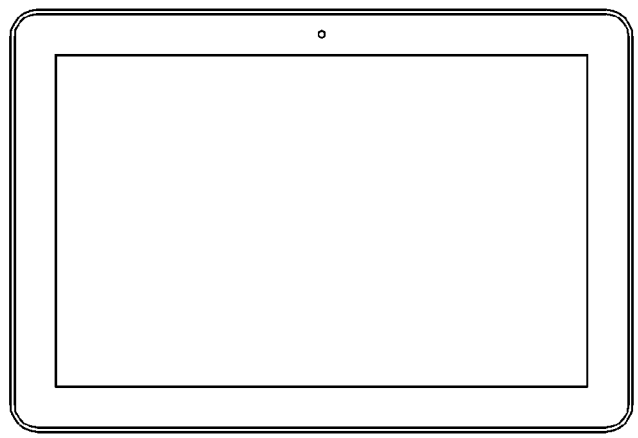
FIGS. 25 and 26 are schematic diagrams of electronic systems to which a semiconductor device according to an exemplary embodiment is applied.
Figure 26:
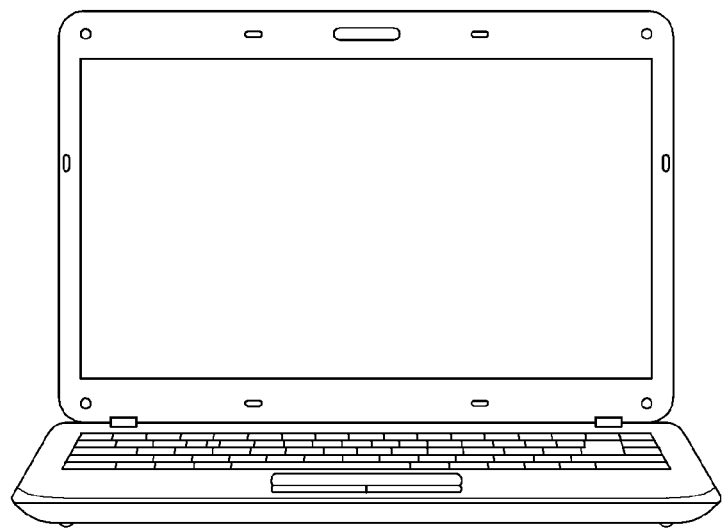

FIGS. 25 and 26 are schematic diagrams of electronic systems to which a semiconductor device according to an exemplary embodiment may be applied.

FIG. 25 illustrates a tablet PC, and FIG. 26 illustrates a laptop computer. At least one of the semiconductor devices 100, 100a, 100b, and 100c according to exemplary embodiments may be incorporated within the tablet PC or the laptop computer. Also, at least one of the semiconductor devices 100, 100a, 100b, and 100c according to exemplary embodiments may be other unshown electronic systems.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a semiconductor substrate; and
an active fin unit protruding on the semiconductor substrate and extending along a first direction, the active fin unit comprising at least two active fins,
wherein each of the at least two active fins comprises a lower active fin surrounded by a device isolation layer and an upper active fin protruding from the device isolation layer,
wherein, when the active fin unit comprises two active fins, each of the two active fins has a left profile and a right profile that are asymmetric to each other about a center line, and when the active fin unit comprises at least three active fins, each of two outermost active fins has a left profile and a right profile that are asymmetric to each other about the center line, and at least one active fin between the two outermost active fins has a left profile and a right profile that are symmetric to each other about the center line,
wherein the center line is defined as a straight line disposed approximately equidistant between left and right points of the lower active fin, which are at a substantially same height above a top surface of the semiconductor substrate, and
wherein the at least one active fin is determined as symmetrical when points of a right side surface and a left side surface of the at least one active fin protruding from the device isolation layer are at a substantially same height, and the at least one active fin is determined as asymmetrical when points of a right side surface and a left side surface of the at least one active fin protruding from the device isolation layer are at a different height.

2. The device of claim 1, wherein the at least one active fin has a substantially same mean inclination between the left and right profiles in a connection portion connecting the lower active fin and the upper active fin when the at least one active fin is determined as symmetrical, and the at least one active fin has a different mean inclination between the left and right profiles in the connection portion connecting the lower active fin and the upper active fin when the at least one active fin is determined as asymmetrical, the mean inclination being measured with respect to the top surface of the semiconductor substrate.

3. The device of claim 1, wherein the at least one active fin has a substantially same mean curvature between the left and right profiles in a connection portion connecting the lower active fin and the upper active fin when the at least one active fin is determined as symmetrical, and the at least one active fin has a different mean curvature between the left and right profiles in the connection portion connecting the lower active fin and the upper active fin when the at least one active fin is determined as asymmetrical.

4. The device of claim 1, wherein, when the active fin unit comprises one active fin, the one active fin has a left profile and a right profile that are symmetric to each other about the center line.

5. A semiconductor device comprising:
a semiconductor substrate; and
an active fin unit protruding on the semiconductor substrate and extending along a first direction, the active fin unit comprising a plurality of active fins,
wherein each of the plurality of active fins comprises a lower active fin surrounded by a device isolation layer and an upper active fin protruding from the device isolation layer,
wherein, two outermost active fins of the plurality of active fins have a left profile and a right profile that are asymmetric to each other about a center line, and points of a right side surface and a left side surface of each of the two outermost active fins protruding from the device isolation layer are at a different height, and
wherein the center line is defined as a straight line disposed approximately equidistant between left and right points of the lower active fin, which are at a substantially same height above a top surface of the semiconductor substrate.

6. The device of claim 5, wherein the active fin unit comprises the two outermost active fins, the device further comprising:
a first device isolation layer disposed between the two outermost active fins; and
second device isolation layers having a different structure from the first device isolation layer disposed on the left side of a left outermost active fin of the two outermost active fins and on the right side of a right outermost active fin of the two outermost active fins.

7. The device of claim 6, wherein the first device isolation layer has a smaller width, as measured in a second direction, than each of the second device isolation layers.

8. The device of claim 5, wherein when the active fin unit comprises at least three active fins, at least one active fin between the two outermost active fins has a left profile and a right profile that are symmetric to each other about the center line, and the at least one active fin between the two outermost active fins has a substantially same mean curvature between the left and right profiles in a bottom portion of the upper active fin.

9. The device of claim 5, wherein each of the lower active fins of the two outermost active fins has a substantially same mean inclination between the left profile and the right profile, the mean inclination being measured with respect to the top surface of the semiconductor substrate.

10. The device of claim 5, wherein each of the two outermost active fins has a different mean inclination between the left and right profiles in a connection portion connecting the lower active fin and the upper active fin, the mean inclination being measured with respect to the top surface of the semiconductor substrate.

11. The device of claim 5, wherein each of the two outermost active fins has a different mean curvature between the left and right profiles in a connection portion connecting the lower active fin and the upper active fin.

12. The device of claim 11, wherein each of the two outermost active fins has a different mean curvature between the left and right profiles in a bottom portion of the upper active fin.

13. The device of claim 5, wherein each of the two outermost active fins has a different mean curvature between the left and right profiles in a bottom portion of the upper active fin.

14. The device of claim 5, wherein the active fin unit comprises at least three active fins, and points of a right side surface and a left side surface of at least one active fin between the two outermost active fins protruding from the device isolation layer are at a substantially same height.

15. The device of claim 5, wherein the active fin unit comprises at least three active fins, and at least one active fin between the two outermost active fins has a substantially same mean inclination between the left and right profiles in a connection portion connecting the lower active fin and the upper active fin, the mean inclination being measured with respect to the top surface of the semiconductor substrate.

16. The device of claim 5, wherein the active fin unit comprises at least three active fins, and at least one active fin between the two outermost active fins has a substantially same mean curvature between the left and right profiles in a connection portion connecting the lower active fin and the upper active fin.

17. A semiconductor device comprising:
a semiconductor substrate; and
an active fin unit protruding on the semiconductor substrate and extending along a first direction, the active fin unit comprising a plurality of active fins,
wherein each of the plurality of active fins comprises a lower active fin surrounded by a device isolation layer and an upper active fin protruding from the device isolation layer,
wherein two outermost active fins of the plurality of active fins have a left profile and a right profile that are asymmetric to each other about a center line, and each of the two outermost active fins has a different mean curvature between the left and right profiles in a connection portion connecting the lower active fin and the upper active fin,
wherein the center line is defined as a straight line disposed approximately equidistant between left and right points of the lower active fin, which are at a substantially same height above a top surface of the semiconductor substrate.

18. The device of claim 17, wherein each of the two outermost active fins has a different mean inclination between the left and right profiles in a connection portion connecting the lower active fin and the upper active fin, the mean inclination being measured with respect to the top surface of the semiconductor substrate.

19. The device of claim 18, wherein points of a right side surface and a left side surface of each of the two outermost active fins protruding from the device isolation layer are at a different height.

20. The device of claim 17, wherein the active fin unit comprises at least three active fins, and at least one active fin between the two outermost active fins has a substantially same mean curvature between the left and right profiles in a connection portion connecting the lower active fin and the upper active fin.

* * * * *